(12) United States Patent
Bhargava et al.

(10) Patent No.: US 11,774,679 B2
(45) Date of Patent: Oct. 3, 2023

(54) RING RESONATOR WITH INTEGRATED PHOTODETECTOR FOR POWER MONITORING

(71) Applicant: Ayar Labs, Inc., Santa Clara, CA (US)

(72) Inventors: Pavan Bhargava, Emeryville, CA (US); John Fini, Oakland, CA (US); Derek Van Orden, San Francisco, CA (US); Chen Sun, Berkeley, CA (US); Mark Wade, Berkeley, CA (US)

(73) Assignee: Ayar Labs, Inc., Santa Clara, CA (US)

( * ) Notice: Subject to any disclaimer, the term of this patent is extended or adjusted under 35 U.S.C. 154(b) by 0 days.

(21) Appl. No.: 17/582,900

(22) Filed: Jan. 24, 2022

(65) Prior Publication Data

US 2022/0146306 A1    May 12, 2022

Related U.S. Application Data

(63) Continuation of application No. 16/831,734, filed on Mar. 26, 2020, now Pat. No. 11,237,333.

(Continued)

(51) Int. Cl.
*G02B 6/293* (2006.01)
*G02F 1/225* (2006.01)
(Continued)

(52) U.S. Cl.
CPC .......... *G02B 6/2934* (2013.01); *G01J 1/0425* (2013.01); *G01J 1/44* (2013.01); *G02B 6/12007* (2013.01); *G02F 1/2257* (2013.01); *H01L 31/02327* (2013.01); *H01L 31/105* (2013.01); *G01J 2001/446* (2013.01); *G02B 6/29338* (2013.01); *G02F 2203/15* (2013.01)

(58) Field of Classification Search
CPC .............. G02B 6/2934; G02B 6/12007; G02B 6/29338; G02B 6/4215; G01J 1/0425; G01J 1/44; G01J 2001/446; G02F 1/2257; G02F 2203/15; H01L 31/02327; H01L 31/105

See application file for complete search history.

(56) References Cited

U.S. PATENT DOCUMENTS 9,939,586 B2 *  4/2018  Timurdogan .......... G02B 6/122
2014/0029892 A1 *  1/2014  Pomerene ......... H01L 21/02532
                                                            438/69

(Continued)

*Primary Examiner* — Ellen E Kim
(74) *Attorney, Agent, or Firm* — Penilla IP, APC

(57) ABSTRACT

A ring resonator device includes a passive optical cavity having a circuitous configuration into which is built a photodetector device. The photodetector device includes a first implant region formed within the passive optical cavity that includes a first type of implanted doping material. The photodetector device includes a second implant region formed within the passive optical cavity that includes a second type of implanted doping material, where the second type of implanted doping material is different than the first type of implanted doping material. The photodetector device includes an intrinsic absorption region present within the passive optical cavity between the first implant region and the second implant region. A first electrical contact is electrically connected to the first implant region and to a detecting circuit. A second electrical contact is electrically connected to the second implant region and to the detecting circuit.

19 Claims, 13 Drawing Sheets

Related U.S. Application Data

(60) Provisional application No. 62/826,965, filed on Mar. 29, 2019.

(51) Int. Cl.
  *G01J 1/04* (2006.01)
  *G01J 1/44* (2006.01)
  *G02B 6/12* (2006.01)
  *H01L 31/0232* (2014.01)
  *H01L 31/105* (2006.01)

(56) References Cited

U.S. PATENT DOCUMENTS

| | | | |
|---|---|---|---|
| 2017/0040487 A1* | 2/2017 | Alloatti | H01L 31/03529 |
| 2018/0062761 A1* | 3/2018 | Wade | H01L 31/0203 |
| 2018/0159293 A1* | 6/2018 | Bovington | H04B 10/572 |
| 2018/0335652 A1* | 11/2018 | Wen | G02F 1/011 |
| 2019/0019903 A1* | 1/2019 | Ye | H01L 31/1804 |
| 2019/0041577 A1* | 2/2019 | Sugiyama | G02B 6/12007 |
| 2020/0124791 A1* | 4/2020 | Bayn | H01L 31/02327 |

* cited by examiner

View (B-B)

View (B-B)

(View C-C)

(View D-D)

(View E-E)

(View F-F)

RING RESONATOR WITH INTEGRATED PHOTODETECTOR FOR POWER MONITORING

CLAIM OF PRIORITY

This application is a continuation application under 35 U.S.C. 120 of prior U.S. application Ser. No. 16/831,734, filed Mar. 26, 2020, which claims priority under 35 U.S.C. 119(e) to U.S. Provisional Patent Application No. 62/826,965, filed Mar. 29, 2019. The disclosure of each above-identified patent application is incorporated herein by reference in its entirety for all purposes.

BACKGROUND

Optical data communication systems operate by modulating laser light to encode digital data patterns. The modulated laser light is transmitted through an optical data network from a sending node to a receiving node. The modulated laser light having arrived at the receiving node is de-modulated to obtain the original digital data patterns. Therefore, implementation and operation of optical data communication systems is dependent upon having reliable and efficient mechanisms for detecting laser light at a given node. Also, it is desirable for the laser light detection mechanisms to have a minimal form factor and be designed as efficiently as possible. It is within this context that the present invention arises.

SUMMARY

In an example embodiment, a ring resonator device having a built-in photodetector device is disclosed. The ring resonator device includes a passive optical cavity having a circuitous configuration. The built-in photodetector device includes a first implant region formed within the passive optical cavity. The first implant region has a first type of doping material implanted into the passive optical cavity. The built-in photodetector device also includes a second implant region formed within the passive optical cavity. The second implant region has a second type of doping material implanted into the passive optical cavity. The second type of doping material is different than the first type of doping material. The built-in photodetector device also includes an intrinsic absorption region present within the passive optical cavity between the first implant region and the second implant region. A first electrical contact is electrically connected to the first implant region. The first electrical contact is also electrically connected to a detecting circuit. A second electrical contact is electrically connected to the second implant region. The second electrical contact is also electrically connected to the detecting circuit.

In an example embodiment, a photodetector system is disclosed. The photodetector system includes a ring resonator device that includes a built-in photodetector device. The ring resonator device includes a passive optical cavity. The built-in photodetector device includes a first implant region formed within the passive optical cavity. The first implant region has a first type of doping material implanted into the passive optical cavity. The built-in photodetector device includes a second implant region formed within the passive optical cavity. The second implant region has a second type of doping material implanted into the passive optical cavity. The second type of doping material is different than the first type of doping material. The built-in photodetector device includes an intrinsic absorption region present within the passive optical cavity between the first implant region and the second implant region. The built-in photodetector device includes a first electrical contact electrically connected to the first implant region and a second electrical contact electrically connected to the second implant region. A detecting circuit is electrically connected to the first electrical contact and the second electrical contact. The detecting circuit is configured to apply a reverse-bias voltage to the first and second implant regions to create a charge collection field within the intrinsic absorption region between the first and second implant regions. The detecting circuit is configured to detect a photocurrent caused by photoabsorption-generated charge carriers swept into the first and second implant regions by the charge collection field.

In an example embodiment, a method is disclosed for detecting optical power within a ring resonator device. The method includes having a photodetector device built in to a passive optical cavity of a ring resonator device. The passive optical cavity is positioned next to an optical waveguide, such that light traveling through the optical waveguide will evanescently couple into the passive optical cavity. The photodetector device includes a first implant region formed within the passive optical cavity. The first implant region has a first type of doping material implanted into the passive optical cavity. The photodetector device also includes a second implant region formed within the passive optical cavity. The second implant region has a second type of doping material implanted into the passive optical cavity. The second type of doping material is different than the first type of doping material. The photodetector device also includes an intrinsic absorption region present within the passive optical cavity between the first implant region and the second implant region. The photodetector device also includes a first electrical contact electrically connected to the first implant region, and a second electrical contact electrically connected to the second implant region. The method also includes electrically connecting the first electrical contact to a detecting circuit. The method also includes electrically connecting the second electrical contact to the detecting circuit. The method also includes operating the detecting circuit to apply a reverse-bias voltage to the first and second implant regions of the photodetector device to create a charge collection field within the intrinsic absorption region between the first and second implant regions. The method also includes operating the detecting circuit to detect a photocurrent caused by photoabsorption-generated charge carriers swept into the first and second implant regions by the charge collection field.

In an example embodiment, a photodetector system is disclosed. The photodetector system includes a tap-off optical waveguide. The photodetector system also includes a first implant region formed on a first side of the tap-off optical waveguide. The first implant region has a first type of implanted doping material. The photodetector system also includes a second implant region formed on a second side of the tap-off optical waveguide opposite from the first implant region. The second implant region has a second type of implanted doping material. The photodetector system also includes an intrinsic absorption region within the tap-off optical waveguide between the first implant region and the second implant region. A first electrical contact is electrically connected to the first implant region. The first electrical contact is electrically connected to a detecting circuit. A second electrical contact is electrically connected to the second implant region. The second electrical contact is electrically connected to the detecting circuit.

In an example embodiment, a method is disclosed for detecting optical power in a ring resonator device. The method includes positioning a tap-off optical waveguide near a passive optical cavity of a ring resonator device such that some light propagating within the passive optical cavity will evanescently couple into the tap-off optical waveguide. The method also includes having a photodetector device coupled to the tap-off optical waveguide. The photodetector device includes a first implant region formed on a first side of the tap-off optical waveguide. The photodetector device also includes a second implant region formed on a second side of the tap-off optical waveguide opposite from the first implant region. The first implant region includes a first type of implanted doping material. The second implant region includes a second type of implanted doping material. The second type of implanted doping material is different than the first type of implanted doping material. The photodetector device includes an intrinsic absorption region within the tap-off optical waveguide between the first implant region and the second implant region. The photodetector device also including a first electrical contact electrically connected to the first implant region, and a second electrical contact electrically connected to the second implant region. The method also includes electrically connecting the first electrical contact to a detecting circuit. The method also includes electrically connecting the second electrical contact to the detecting circuit. The method also includes operating the detecting circuit to apply a reverse-bias voltage to the first and second implant regions of the photodetector device to create a charge collection field within the intrinsic absorption region between the first and second implant regions. The method also includes operating the detecting circuit to detect a photocurrent caused by photoabsorption-generated charge carriers swept into the first and second implant regions by the charge collection field.

In an example embodiment, a photodetector system is disclosed. The photodetector system includes an intrinsic absorption region. The photodetector system also includes a first implant region formed on a first side of the intrinsic absorption region. The first implant region includes a first type of implanted doping material. The photodetector system also includes a second implant region formed on a second side of the intrinsic absorption region opposite from the first implant region. The second implant region includes a second type of implanted doping material. The second type of implanted doping material is different than the first type of implanted doping material. The photodetector system also includes a first electrical contact electrically connected to the first implant region. The first electrical contact is electrically connected to a detecting circuit. The photodetector system also includes a second electrical contact electrically connected to the second implant region. The second electrical contact is electrically connected to the detecting circuit.

In an example embodiment, a method is disclosed for detecting optical power in a ring resonator device. The method includes having a photodetector device that includes an intrinsic absorption region. The photodetector device also includes a first implant region formed on a first side of the intrinsic absorption region. The photodetector device also includes a second implant region formed on a second side of the intrinsic absorption region opposite from the first implant region. The first implant region includes a first type of implanted doping material. The second implant region includes a second type of implanted doping material. The second type of implanted doping material is different than the first type of implanted doping material. The photodetector device also includes a first electrical contact electrically connected to the first implant region, and a second electrical contact electrically connected to the second implant region. The method also includes positioning the photodetector device near a passive optical cavity of a ring resonator device such that some light propagating within the passive optical cavity will evanescently couple into the intrinsic absorption region of the photodetector device. The method also includes electrically connecting the first electrical contact to a detecting circuit. The method also includes electrically connecting the second electrical contact to the detecting circuit. The method also includes operating the detecting circuit to apply a reverse-bias voltage to the first and second implant regions of the photodetector device to create a charge collection field within the intrinsic absorption region between the first and second implant regions. The method also includes operating the detecting circuit to detect a photocurrent caused by photoabsorption-generated charge carriers swept into the first and second implant regions by the charge collection field.

DETAILED DESCRIPTION

Figure 1A:
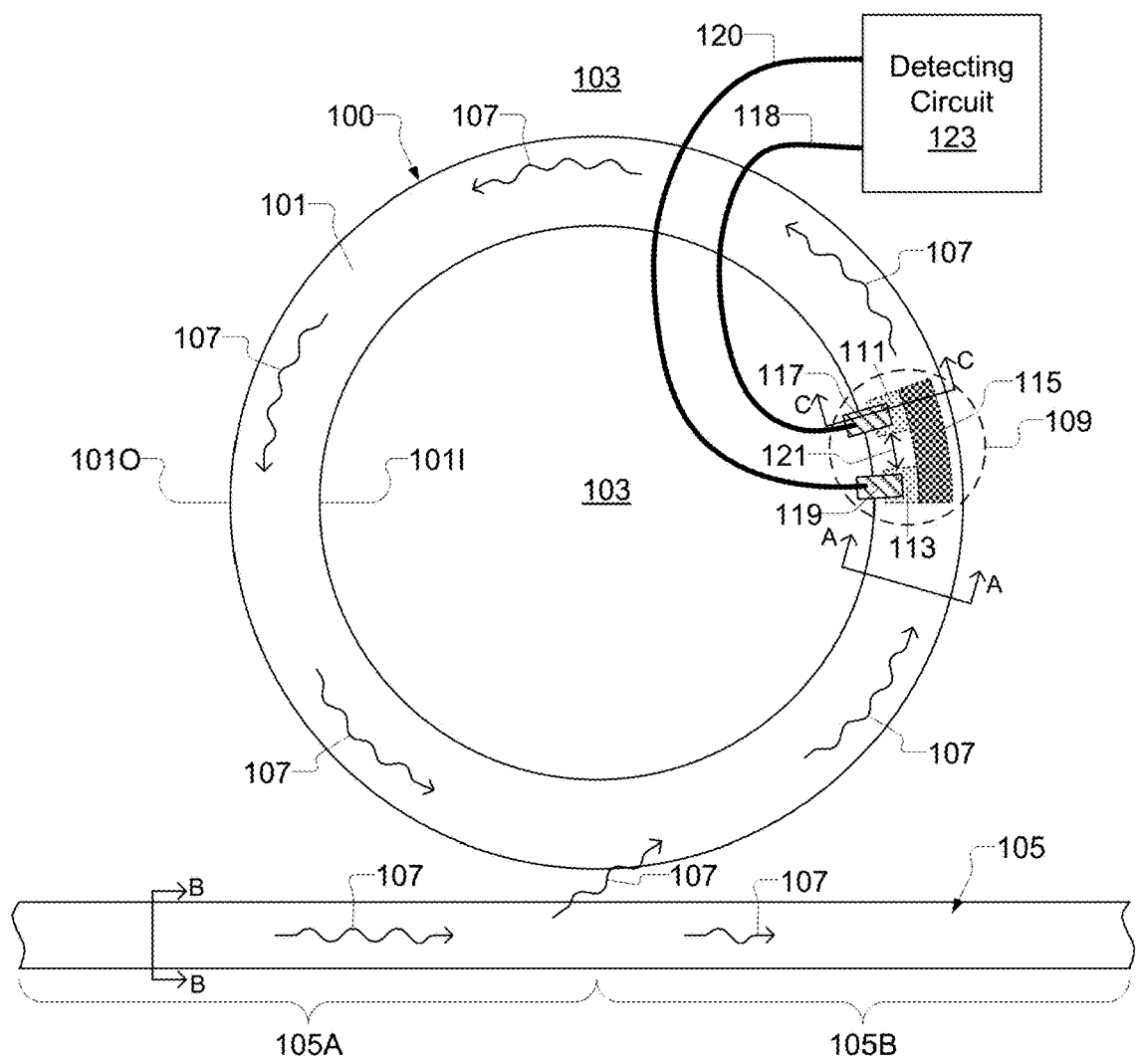
FIG. 1A shows a top view of a ring resonator device, in accordance with some embodiments of the present invention.

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

Systems and associated methods are disclosed herein for monitoring optical power in a ring resonator device or disk resonator device in real-time. The optical power monitoring is accomplished using a photodetector device (photodiode) that absorbs some fraction of the photonic energy stored in the ring/disk resonator device and converts it to an electrical signal, enabling real-time detection of the stored photonic energy. The optical power monitoring can be important for applications requiring active, dynamic tuning of a ring/disk resonator device, including controlling the resonance wavelength and device temperature of the ring/disk resonator device.

Optical cavities are used in a variety of applications in optical data communications systems, including in applications such as lasers, optical modulators, optical splitters, optical routers, optical switches, and optical detectors. Optical cavities may show strong wavelength selectivity, and are frequently used in systems that rely on multiple optical signals transmitting information at different wavelengths. Ring/disk resonator devices, in particular, enable configurations in which light that is coupled from an input optical waveguide into the optical cavity of the ring/disk resonator device can be efficiently routed to a separate output optical waveguide, or else absorbed within the ring/disk resonator device, at specific wavelengths. Ring/disk resonator devices may also be used in sensing applications, such as biological or chemical sensing, where a high concentration of optical power in a small area is needed.

Various embodiments are disclosed herein for an optical resonator device that includes a built-in photodetector device for monitoring optical power present in the optical resonator device in real-time, and for generating an electrical signal indicating the monitored real-time optical power present in the optical resonator device. In some embodiments, the optical resonator device is configured as a ring resonator device. In some embodiments, the optical resonator device is configured as a disk resonator device. The embodiments disclosed herein are described with regard to a ring resonator device. However, it should be understood that any of the embodiments disclosed herein can be alternatively and equivalently implemented using a disk resonator device in place of the ring resonator device, where the disk resonator device has a disk-shaped passive optical cavity instead of the ring-shaped passive optical cavity of the ring resonator device.

The photodetector device that is built into the optical resonator device is configured to produce a photocurrent based on the optical power present in the optical resonator device. The photocurrent is then processed through a detecting circuit to determine a magnitude of the optical power present in the optical resonator device in real-time and/or a relative change in optical power present in the optical resonator device in real-time. The optical resonator device with built-in photodetector device as disclosed herein is designed and configured to couple-in and detect light having one or more wavelengths. It should be understood that the term "wavelength" as used herein refers to the wavelength of electromagnetic radiation. And, the term "light" as used herein refers to electromagnetic radiation within a portion of the electromagnetic spectrum that is usable by optical data communication systems. In some embodiments, the portion of the electromagnetic spectrum includes light having wavelengths within a range extending from about 1100 nanometers to about 1565 nanometers (covering from the O-Band to the C-Band, inclusively, of the electromagnetic spectrum). However, it should be understood that the portion of the electromagnetic spectrum as referred to herein can include light having wavelengths either less than 1100 nanometers or greater than 1565 nanometers, so long as the light is usable by an optical data communication system for encoding, transmission, and decoding of digital data through modulation/de-modulation of the light. In some embodiments, the light used in optical data communication systems has wavelengths in the near-infrared portion of the electromagnetic spectrum. It should be understood that light may be confined to propagate in an optical waveguide, such as (but not limited to) an optical fiber or an optical waveguide within a planar lightwave circuit (PLC). In some embodiments, the light can be polarized. And, in some embodiments, the light has a single wavelength, where the single wavelength can refer to either essentially one wavelength or can refer to a narrow band of wavelengths that can be identified and processed by an optical data communication system as if it were a single wavelength.

FIG. 1A shows a top view of a ring resonator device 100, in accordance with some embodiments of the present invention. The ring resonator device 100 is configured as a passive optical cavity 101 having a circuitous configuration. In some embodiments, the passive optical cavity 101 has a substantially annular shape, e.g., a ring shape, defined by an inner wall surface 101I and an outer wall surface 101O. In various embodiments, the ring-shaped optical cavity can have a substantially circular shape or an oval shape. In various embodiments, the ring resonator device 100 can be used to perform optical modulation, optical detection, opto-mechanical transduction, chemical and/or biological sensing, among other operations, by way of example. In an alternative embodiment where in the ring resonator device 100 is defined as a disk resonator device, the passive optical cavity 101 is defined as a disk-shaped optical cavity. In various embodiments, the disk-shaped optical cavity can have a substantially circular shape or an oval shape.

In various embodiments, the passive optical cavity 101 can be formed of crystalline silicon, polycrystalline silicon, amorphous silicon, silica, glass, silicon nitride (SiN, $Si_3N_4$), or III-V semiconductor material, among others, by way of example. In some embodiments, the passive optical cavity 101 can be formed by etching its structure from a layer of the material of which it is formed. However, it should be understood that in various embodiments the passive optical cavity 101 can be formed by essentially any suitable manufacturing technique or combination of techniques, of which etching is an example. Also, it should be understood that the passive optical cavity 101 is surrounded by a cladding material 103 that has a lower refractive index relative to the material of the passive optical cavity 101. In various embodiments, by way of example, the cladding material 103 can be $SiO_2$, $Si_3N_4$, air, or another material having a suitably lower refractive index relative to whatever material is used for the passive optical cavity 101.

In some embodiments, a horizontal cross-section of the outer wall surface 1010 of the passive optical cavity 101 is configured to have a substantially circular shape. In some embodiments, a radius of the outer wall surface 1010 of the passive optical cavity 101 is within a range extending from about 2000 nanometers (nm) (or 2 micrometers) to about 50000 nm (or 50 micrometers). In some embodiments, the radius of the outer wall surface 1010 of the passive optical cavity 101 is about 5000 nm. It should be understood, however, that in some embodiments the radius of the outer wall surface 1010 of the passive optical cavity 101 can be less than 2000 nm or greater than 50000 nm. Also, in some embodiments, the passive optical cavity 101 may have a non-circular outer perimeter. For example, in some embodiments, the passive optical cavity 101 can have an oval-shaped outer perimeter. Also, in some embodiments, the passive optical cavity 101 can have a circuitous outer perimeter that is non-symmetric about a centerline of the ring resonator device 100.

Figure 1B:
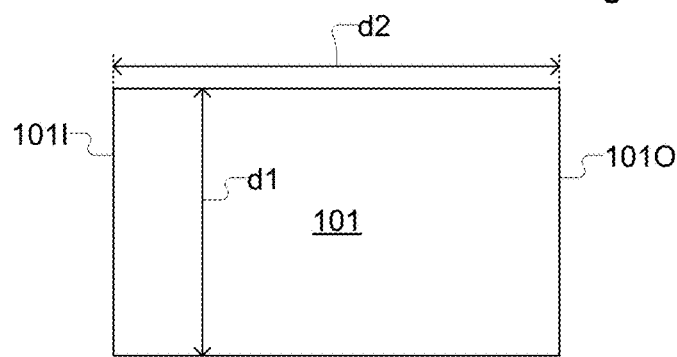
FIG. 1B shows a vertical cross-section view A-A of the passive optical cavity, as referenced in FIG. 1A, in accordance with some embodiments of the present invention.

FIG. 1B shows a vertical cross-section view A-A of the passive optical cavity 101, as referenced in FIG. 1A, in accordance with some embodiments of the present invention. In the example configuration of FIG. 1B, the passive optical cavity 101 has a substantially uniform vertical thickness d1. In some embodiments, the vertical thickness d1 is within a range extending from about 30 nm to about 300 nm. In some embodiments, the vertical thickness d1 is about 80 nm. It should be understood, however, that in other embodiments the vertical thickness d1 can be either less than 30 nm or greater than 300 nm. Also, in the example configuration of FIG. 1B, the passive optical cavity 101 has a substantially uniform radial width d2. In some embodiments, the radial width d2 is within a range extending from about 300 nm to about 3000 nm (or 3 micrometers). In some embodiments, the radial width d2 is about 1200 nm. It should be understood, however, that in other embodiments the radial width d2 can be either less than 300 nm or greater than 3000 nm.

Figure 1C:
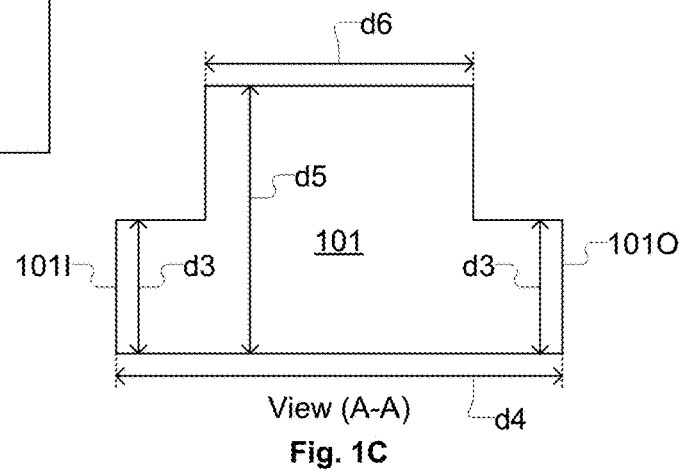
FIG. 1C shows another vertical cross-section view A-A of the passive optical cavity, as referenced in FIG. 1A, in accordance with some embodiments of the present invention.

FIG. 1C shows another vertical cross-section view A-A of the passive optical cavity 101, as referenced in FIG. 1A, in accordance with some embodiments of the present invention. In the example configuration of FIG. 1C, the passive optical cavity 101 has a stepped shape in which a central region of the passive optical cavity 101 has a vertical thickness d5 that is greater than a vertical thickness d3 of inner and outer portions of the passive optical cavity 101, formed inside and outside, respectively of the central region of the passive optical cavity 101. In some embodiments, the vertical thickness d3 is within a range extending from about 50 nm to about 150 nm. In some embodiments, the vertical thickness d3 is about 80 nm. It should be understood, however, that in other embodiments the vertical thickness d3 can be either less than 50 nm or greater than 150 nm. In some embodiments, the vertical thickness d5 is within a range extending from about 150 nm to about 300 nm. In some embodiments, the vertical thickness d5 is about 200 nm. It should be understood, however, that in other embodiments the vertical thickness d5 can be either less than 150 nm or greater than 300 nm. Also, in the example configuration of FIG. 1C, the passive optical cavity 101 has a radial width d4. In some embodiments, the radial width d4 is within a range extending from about 300 nm to about 3000 nm (or 3 micrometers). In some embodiments, the radial width d4 is about 1200 nm. It should be understood, however, that in other embodiments the radial width d4 can be either less than 300 nm or greater than 3000 nm. Also, in the example configuration of FIG. 1C, the central region of the passive optical cavity 101 has a radial width d6. In some embodiments, the radial width d6 is within a range extending from about 200 nm to about 1000 nm (or 1 micrometer). In some embodiments, the radial width d6 is about 500 nm. It should be understood, however, that in other embodiments the radial width d6 can be either less than 200 nm or greater than 1000 nm. In some embodiments, the example configuration of FIG. 1C may be inverted vertically, such that the central region with vertical thickness d5 protrudes downwards, as opposed to upwards as is shown in FIG. 1C.

FIG. 1A also shows the ring resonator device 100 positioned next to an optical waveguide 105, such that light 107 traveling through the optical waveguide 105 can evanescently couple into the passive optical cavity 101 of the ring resonator device 100. The optical waveguide 105 includes an input portion 105A and an output portion 105B. Incoming light 107 travels through the input portion 105A of the optical waveguide 105 toward the ring resonator device 100. As the light 107 travels through the optical waveguide 105 near the ring resonator device 100, a portion of the light 107 will couple into the passive optical cavity 101 of the ring resonator device 100, and a remaining portion of the light 107 will travel on through the output portion 105B of the optical waveguide 105.

In the example embodiment of FIG. 1A, the optical waveguide 105 has a substantially linear configuration as it extends past the ring resonator device 100. However, in other embodiments the optical waveguide 105 can have a non-linear configuration, such that the optical waveguide 105 curves around a portion of the ring resonator device 100. In some embodiments, a portion of the optical waveguide 105 that curves around the portion of the ring resonator device 100 can have a radius of curvature similar to that of the passive optical cavity 101 of the ring resonator device 100. In some embodiments, a portion of the optical waveguide 105 that curves around the portion of the ring resonator device 100 does not have a curvature similar to that of the passive optical cavity 101 of the ring resonator device 100, but does traverse past the passive optical cavity 101 such that a location of minimum separation distance exists between the optical waveguide 105 and the passive optical cavity 101. It should be understood that the optical waveguide 105 is configured (shaped, sized, and positioned) to enable coupling of light 107 that travels through the optical waveguide 105 into the passive optical cavity 101 of the ring resonator device 100 as the light travels through the optical waveguide 105 near the ring resonator device 100.

In some embodiments, the material composition and dimensions of the optical waveguide 105 are defined such that only desired optical modes of light couple into the passive optical cavity 101 of the ring resonator device 100. For example, in some embodiments, the optical waveguide 105 is configured such that coupling of light into the passive optical cavity 101 of the ring resonator device 100 is limited to a fundamental optical mode of the light. In various embodiments, the optical waveguide 105 can be formed of essentially any material through which light can be channeled from an entry location on the optical waveguide 105 to an exit location on the optical waveguide 105. For example, in various embodiments, the optical waveguide 105 can be formed of monocrystalline silicon, polycrystalline silicon, glass, SiN, $SiO_2$, germanium-oxide, and/or silica, among other materials. In some embodiments, the optical waveguide 105 is configured to maintain a polarization of light as it travels through the optical waveguide 105.

Figure 1D:
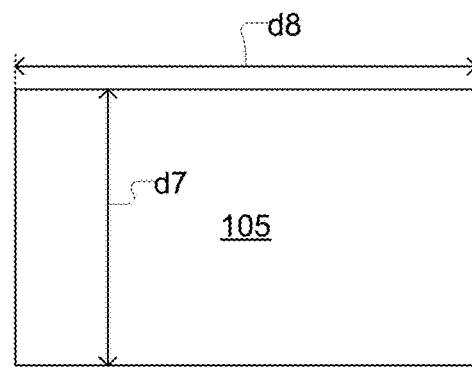
FIG. 1D shows a vertical cross-section view B-B of the optical waveguide, as referenced in FIG. 1A, in accordance with some embodiments of the present invention.

FIG. 1D shows a vertical cross-section view B-B of the optical waveguide 105, as referenced in FIG. 1A, in accordance with some embodiments of the present invention. In the example configuration of FIG. 1D, the optical waveguide 105 has a substantially uniform vertical thickness d7. In some embodiments, the vertical thickness d7 is within a range extending from about 30 nm to about 300 nm. In some embodiments, the vertical thickness d7 is about 80 nm. It should be understood, however, that in other embodiments the vertical thickness d7 can be either less than 30 nm or greater than 300 nm. Also, in the example configuration of FIG. 1D, the optical waveguide 105 has a width d8. In some embodiments, the width d8 is within a range extending from about 250 nm to about 1000 nm (or 1 micrometer). In some embodiments, the width d8 is about 400 nm. It should be understood, however, that in other embodiments the width d8 can be either less than 250 nm or greater than 1000 nm.

Figure 1E:
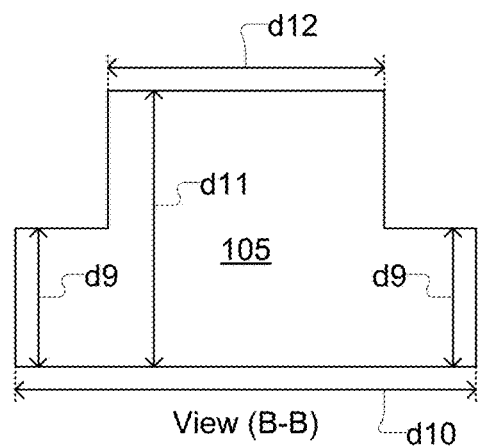
FIG. 1E shows another vertical cross-section view B-B of the optical waveguide, as referenced in FIG. 1A, in accordance with some embodiments of the present invention.

FIG. 1E shows another vertical cross-section view B-B of the optical waveguide 105, as referenced in FIG. 1A, in accordance with some embodiments of the present invention. In the example configuration of FIG. 1E, the optical waveguide 105 has a stepped shape in which a central region of the optical waveguide 105 has a vertical thickness d11 that is greater than a vertical thickness d9 of inner and outer portions of the optical waveguide 105, formed inside and outside, respectively of the central region of the optical waveguide 105. In some embodiments, the vertical thickness d9 is within a range extending from about 50 nm to about 150 nm. In some embodiments, the vertical thickness d9 is about 80 nm. It should be understood, however, that in other embodiments the vertical thickness d9 can be either less than 50 nm or greater than 150 nm. In some embodiments, the vertical thickness d11 is within a range extending from about 150 nm to about 300 nm. In some embodiments, the vertical thickness d11 is about 200 nm. It should be understood, however, that in other embodiments the vertical thickness d11 can be either less than 150 nm or greater than 300 nm. Also, in the example configuration of FIG. 1E, the optical waveguide 105 has a width d10. In some embodiments, the width d10 is within a range extending from about 250 nm to about 1000 nm (or 1 micrometer). In some embodiments, the width d10 is about 400 nm. It should be understood, however, that in other embodiments the width d10 can be either less than 250 nm or greater than 1000 nm. Also, in the example configuration of FIG. 1E, the central region of the optical waveguide 105 has a width d12. In some embodiments, the width d12 is within a range extending from about 200 nm to about 1000 nm. In some embodiments, the width d12 is about 500 nm. It should be understood, however, that in other embodiments the width d12 can be either less than 200 nm or greater than 1000 nm. In some embodiments, the example configuration of FIG. 1E may be inverted vertically, such that the central region with vertical thickness d11 protrudes downwards, as opposed to upwards as is shown in FIG. 1E.

With reference back to FIG. 1A, the ring resonator device 100 includes a built-in photodetector device 109. The photodetector device 109 is built directly into the passive optical cavity 101 of the ring resonator device 100. The photodetector device 109 includes a first implant region 111 and a second implant region 113. The first implant region 111 is formed by implanting a portion of the passive optical cavity 101 corresponding to the first implant region 111 with a first type of doping material. Similarly, the second implant region 113 is formed by implanting a portion of the passive optical cavity 101 corresponding to the second implant region 113 with a second type of doping material. The first type of doping material and the second type of doping material are different. For example, in some embodiments, the first type of doping material can be a p-type doping material, and the second type of doping material can be an n-type doping material. Or, in some embodiments, the first type of doping material can be an n-type doping material, and the second type of doping material can be an p-type doping material. In some embodiments, the p-type doping material can be boron implanted at a concentration within a range extending from about $5E17$ atoms/$cm^3$ to about $2E18$ atoms/$cm^3$, or within a range extending from about $1E17$ atoms/$cm^3$ to about $1E19$ atoms/$cm^3$, or within a range greater than or equal to about $1E19$ atoms/$cm^3$. It should be understood that in other embodiments, the p-type doping material can be a material other than boron, such as gallium or indium, among others. In some embodiments, the n-type doping material can be phosphorus and/or arsenic implanted at a concentration within a range extending from about $5E17$ atoms/$cm^3$ to about $2E18$ atoms/$cm^3$, or within a range extending from about $1E17$ atoms/$cm^3$ to about $1E19$ atoms/$cm^3$, or within a range greater than or equal to about $1E19$ atoms/$cm^3$. It should be understood that in other embodiments, the n-type doping material can be a material other than phosphorus or arsenic, such as antimony, bismuth, or lithium, among others.

The first implant region 111 and the second implant region 113 are separated by a distance 121, such that the first implant region 111 and the second implant region 113 collectively form a PIN diode, with a portion of the passive optical cavity 101 that extends between the first implant region 111 and the second implant region 113 functioning as an intrinsic absorption region 115. The intrinsic absorption region 115 represents the detecting region (photodiode junction) of the photodetector device 109. The photodetector device 109 can be configured and sized to occupy a small portion (e.g., 5% to 10% by volume, or even less) of the passive optical cavity 101 of the ring resonator device 100 in order to minimize the impact of the photodetector device 109 on the overall functionality of the ring resonator device 100. It should be understood that the photodetector device 109 is built into the passive optical cavity 101 of the ring resonator device 100 to absorb a fraction of the light 107 that couples into the passive optical cavity 101 and generate a corresponding electrical signal that can be monitored and measured.

Figure 1F:
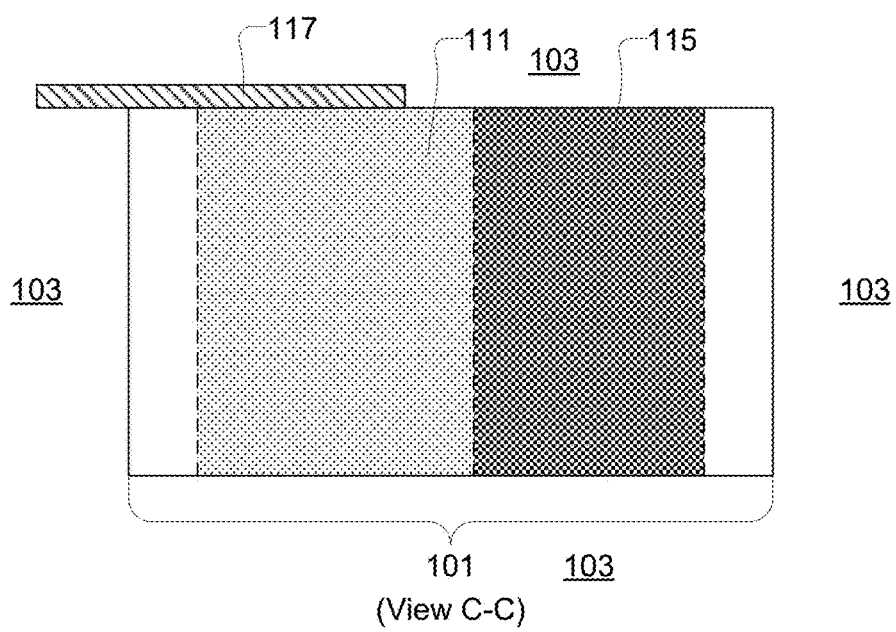
FIG. 1F shows a vertical cross-section view C-C through a section of the photodetector device within passive optical cavity, as referenced in FIG. 1A, in accordance with some embodiments of the present invention.

FIG. 1F shows a vertical cross-section view C-C through a section of the photodetector device 109 within passive optical cavity 101, as referenced in FIG. 1A, in accordance with some embodiments of the present invention. In the example ring resonator device 100, the first implant region 111 and the second implant region 113 are formed within an inner radial portion of the passive optical cavity 101, and the intrinsic absorption region 115 is present in an outer radial portion of the passive optical cavity 101. In various embodiments, the first implant region 111 and the second implant region 113 are formed within the passive optical cavity 101 such that the intrinsic absorption region 115 will coincide with a radial segment of the passive optical cavity 101 that has a higher (or highest) photon energy density as the light 107 travels around/through the passive optical cavity 101. In some embodiments, the first implant region 111, the second implant region 113, and the intrinsic absorption region 115 extend through a majority of the entire vertical thickness of the passive optical cavity 101. In some embodiments, the first implant region 111, the second implant region 113, and the intrinsic absorption region 115 extend through essentially the entire vertical thickness of the passive optical cavity 101.

The intrinsic absorption region 115 is formed of a semiconductor material that has sufficient optical absorption at the optical wavelength of operation of the ring resonator device 100 so as to generate a photocurrent that can be measured by a detecting circuit 123. In some embodiments, the intrinsic absorption region 115 is formed of the same material that forms the passive optical cavity 101. In some embodiments, the intrinsic absorption region 115 is formed by modifying the material that forms the passive optical cavity 101. In some embodiments, the intrinsic absorption region 115 is formed by a material that is different from the material that forms the passive optical cavity 101. As the light 107 travels through the intrinsic absorption region 115, photoabsorption occurs in the intrinsic absorption region 115. More specifically, as light 107 travels through the intrinsic absorption region 115, photons of the light 107 are absorbed to generate charge carriers, i.e., to generate free electrons and corresponding "holes" (positive charges due to movement of free electrons), within the intrinsic absorption region 115. The photodetector device 109 is operated to generate an electric field between the first implant region 111 and the second implant region 113 and through the intrinsic absorption region 115, wherein this electric field functions as a charge collection field. The charge carriers generated by photoabsorption within the intrinsic absorption region 115 are collected into the first implant region 111 and the second implant region 113 under the influence of the charge collection field. The portion of light 107 that couples into the passive optical cavity 101 of the ring resonator device 100 from the optical waveguide 105 is guided around the passive optical cavity 101 and interacts with the intrinsic absorption region 115 to generate electrical charge carriers that can be swept up by the charge collection field and detected as a photocurrent, thereby electrically signaling detection of the light having traveled through the passive optical cavity 101 of the ring resonator device 100.

The photodetector device 109 includes a first electrical contact 117 configured and positioned to electrically connect with the first implant region 111. The photodetector device 109 also includes a second electrical contact 119 configured and positioned to electrically connect with the second implant region 113. In some embodiments, the first electrical contact 117 and the second electrical contact 119 are placed over the inner surface 101I of the ring resonator device 101. More specifically, in some embodiments, the first electrical contact 117 and the second electrical contact 119 are placed over the inner surface 101I of the ring resonator device 101 to physically separate the first electrical contact 117 and the second electrical contact 119 from the ring resonator device 100 fundamental optical mode, thereby avoiding excessive optical absorption by the photodetector device 109. In various embodiments, the first electrical contact 117 and the second electrical contact 119 can be configured and positioned as needed to electrically connect with the first implant region 111 and the second implant region 113, respectively. In various embodiments, the first electrical contact 117 and the second electrical contact 119 can be formed by one or more of copper, aluminum, platinum, titanium, nickel, cobalt, tungsten, platinum silicide, titanium silicide, nickel silicide, and cobalt silicide, or any other electrically conductive material used to form Osmic contacts with optical waveguide materials, such as silicon.

The first electrical contact 117 is electrically connected to a detecting circuit 123 by an electrical connection 118. The second electrical contact 119 is electrically connected to the detecting circuit 123 by an electrical connection 120. The detecting circuit 123 operates to monitor and measure electrical current that flows between and through the first electrical contact 117 and the second electrical contact 119, by way of the first implant region 111 and the second implant region 113, respectively. The detecting circuit 123 also operates to apply opposite voltages to the first electrical contact 117 and the second electrical contact 119 such that the photodetector device 109 operates as a reverse-biased PIN diode. This means that if the first implant region 111 is a p-type region and the second implant region 113 in an n-type region, the voltage applied to the first implant region 111 (the p-type region) is less than the voltage applied to the second implant region 113 (the n-type region). For example, if the first implant region 111 is doped as a p-type region and the second implant region 113 is doped as an n-type region, then the detecting circuit 123 operates to apply a voltage to the first electrical contact 117 that is less than the voltage applied to the second electrical contact 119. Or, if the first implant region 111 is doped as an n-type region and the second implant region 113 is doped as a p-type region, then the detecting circuit 123 operates to apply a voltage to the first electrical contact 117 that is greater than the voltage applied the second electrical contact 119.

With the detecting circuit 123 operating to apply the voltage difference between the first electrical contact 117 and the second electrical contact 119, the charge collection field is generated within the intrinsic absorption region 115. And, as photoabsorption-generated charge carriers are swept from the intrinsic absorption region 115 into the first implant region 111 and the second implant region 113, a corresponding electrical current is detected by the detecting circuit 123. The strength of the electrical current signal generated by the photodetector device 109 is correlated to the level of optical power in the ring resonator device 100. In some embodiments, the photoabsorption-generated electrical current detected by the detecting circuit 123 is used to measure an amount of optical power present in the ring resonator device 100. More specifically, with the photodetector device 109 and the detecting circuit 123 calibrated, the electrical current signal generated by the photodetector device 109 can be used to estimate the absolute optical power within the ring resonator device 100. In some embodiments, the photoabsorption-generated electrical current detected by the detecting circuit 123 is used to measure an amount of change in optical power present in the ring resonator device 100. For example, the electrical current signal generated by the photodetector device 109 can be used for relative or comparative measurements of the optical power in the ring resonator device 100 over time, which may be used in applications such as dynamic tuning or stabilization of the ring resonator device 109. In view of the foregoing, it should be understood that the photodetector device 109 and the detecting circuit 123 are usable to monitor either absolute optical power and/or a change in optical power within the ring resonator device 100 in real-time.

In various embodiments, the ring resonator device 100 and optical waveguide 105 can be implemented in essentially any material system in which an optical resonator device can be implemented, including by way of example, silicon surrounded by silicon dioxide cladding, or any number of dielectric materials that support reasonably high refractive index contrast and low propagation loss at optical and infrared frequencies. In some embodiments, each of the optical waveguide 105 and ring resonator device 100 is formed of a high refractive index material (e.g., silicon) within a layer of a low refractive index material (e.g., oxide). In some embodiments, each of the optical waveguide 105 and ring resonator device 100 is formed to have an opposite refractive polarity in which each of the optical waveguide 105 and ring resonator device 100 is defined by an absence of high refractive index material within a guiding layer of high refractive index material.

Figure 1G:
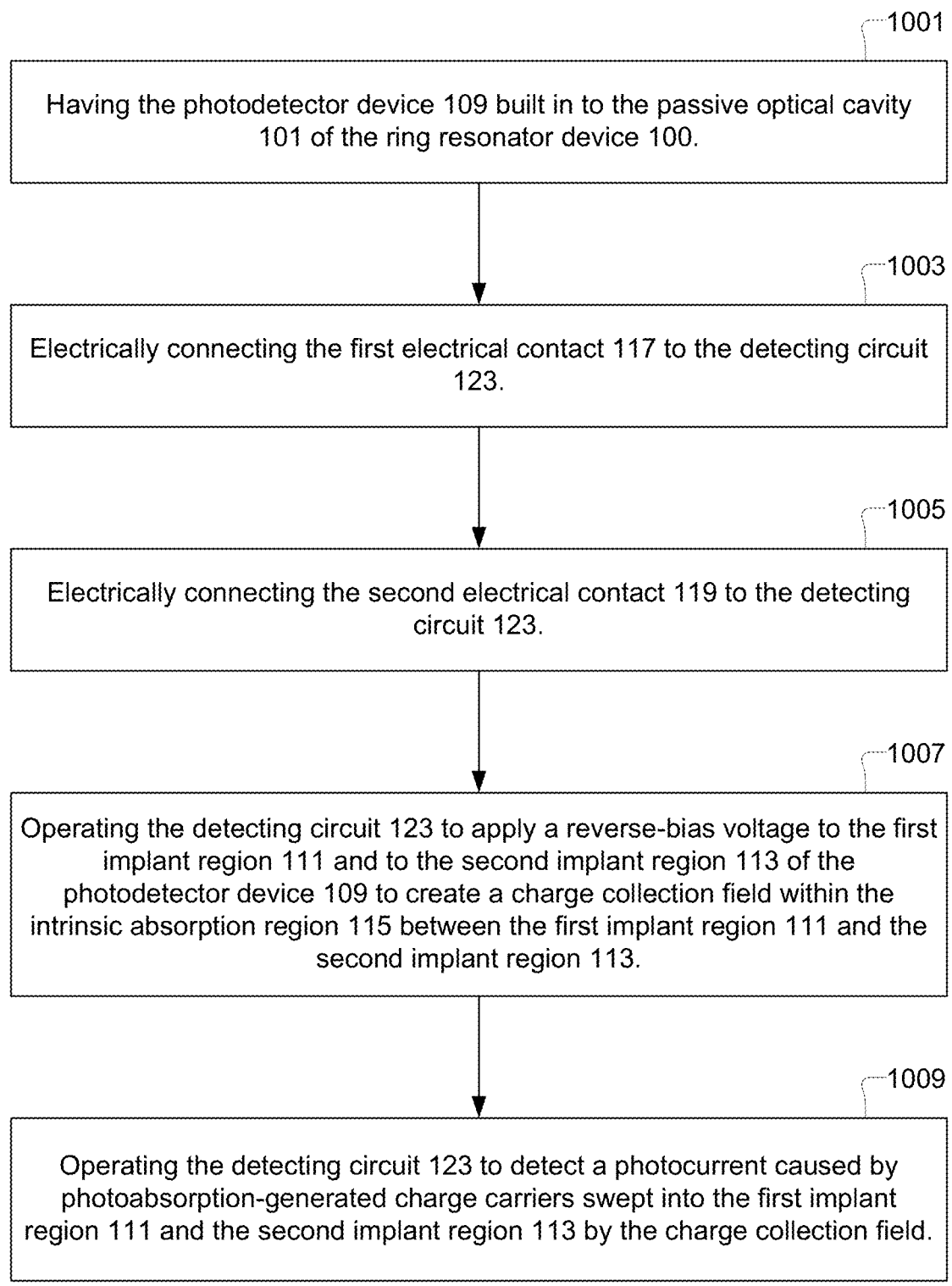
FIG. 1G shows a flowchart of a method for detecting optical power within a ring resonator device, in accordance with some embodiments.

FIG. 1G shows a flowchart of a method for detecting optical power within a ring resonator device, in accordance with some embodiments. The method includes an operation 1001 for having a photodetector device (109) built in to a passive optical cavity (101) of a ring resonator device (100). The passive optical cavity (101) is positioned next to an optical waveguide (105) such that light traveling through the optical waveguide (105) will evanescently couple into the passive optical cavity (101). The photodetector device (109) includes a first implant region (111) formed within the passive optical cavity (101). The first implant region (111) has a first type of doping material implanted into the passive optical cavity (101). The photodetector device also includes a second implant region (113) formed within the passive optical cavity (101). The second implant region (113) has a second type of doping material implanted into the passive optical cavity (101). The second type of doping material is different than the first type of doping material. The photodetector device also includes an intrinsic absorption region (115) present within the passive optical cavity (101) between the first implant region (111) and the second implant region (113). The photodetector device (109) also includes a first electrical contact (117) electrically connected to the first implant region (111), and a second electrical contact (119) electrically connected to the second implant region (113).

The method also includes an operation 1003 for electrically connecting the first electrical contact (117) to a detecting circuit (123). The method also includes an operation 1005 for electrically connecting the second electrical contact (119) to the detecting circuit (123). The method also includes an operation 1007 for operating the detecting circuit (123) to apply a reverse-bias voltage to the first implant region (111) and to the second implant region (113) of the photodetector device (109) to create a charge collection field within the intrinsic absorption region (115) between the first implant region (111) and the second implant region (113). The method also includes an operation 1009 for operating the detecting circuit (109) to detect a photocurrent caused by photoabsorption-generated charge carriers swept into the first implant region (111) and the second implant region (113) by the charge collection field.

In some embodiments, the method of FIG. 1G also includes operating a second photodetector device (200) formed within the optical waveguide (105) at a location optically downstream from a location where the optical waveguide (105) passes closest to the passive optical cavity (101) of the ring resonator device (100). The second photodetector device (200) includes a first implant region (201) formed on a first side of the optical waveguide (105), and a second implant region (203) formed on a second side of the optical waveguide (105) opposite from the first implant region (201). A region of the optical waveguide (105) between the first implant region (201) and the second implant region (203) is an intrinsic absorption region (205). The second photodetector device (200) includes a first electrical contact (207) electrically connected to the first implant region (201), and a second electrical contact (209) electrically connected to the second implant region (203). Each of the first electrical contact (207) and the second electrical contact (209) of the second photodetector device (200) is electrically connected to the detecting circuit (123). The method also includes operation the detecting circuit (123) to apply a reverse-bias voltage to the first implant region (201) and the second implant region (203) of the second photodetector device (200) to create a charge collection field within the intrinsic absorption region (205) within the optical waveguide (105) between the first implant region (201) and the second implant region (203) of the second photodetector device (200). The method also includes operating the detecting circuit (123) to detect a photocurrent caused by photoabsorption-generated charge carriers swept into the first implant region (201) and the second implant region (203) of the second photodetector device (200) by the charge collection field within the intrinsic absorption region (205) within the optical waveguide (105). The method also includes using the photocurrent detected within the passive optical cavity (101) by the photodetector device (109) built in to the passive optical cavity (101) and/or the photocurrent detected within the optical waveguide (105) by the second photodetector device (200) to determine an amount of optical power within the ring resonator device (100).

Figure 1H:
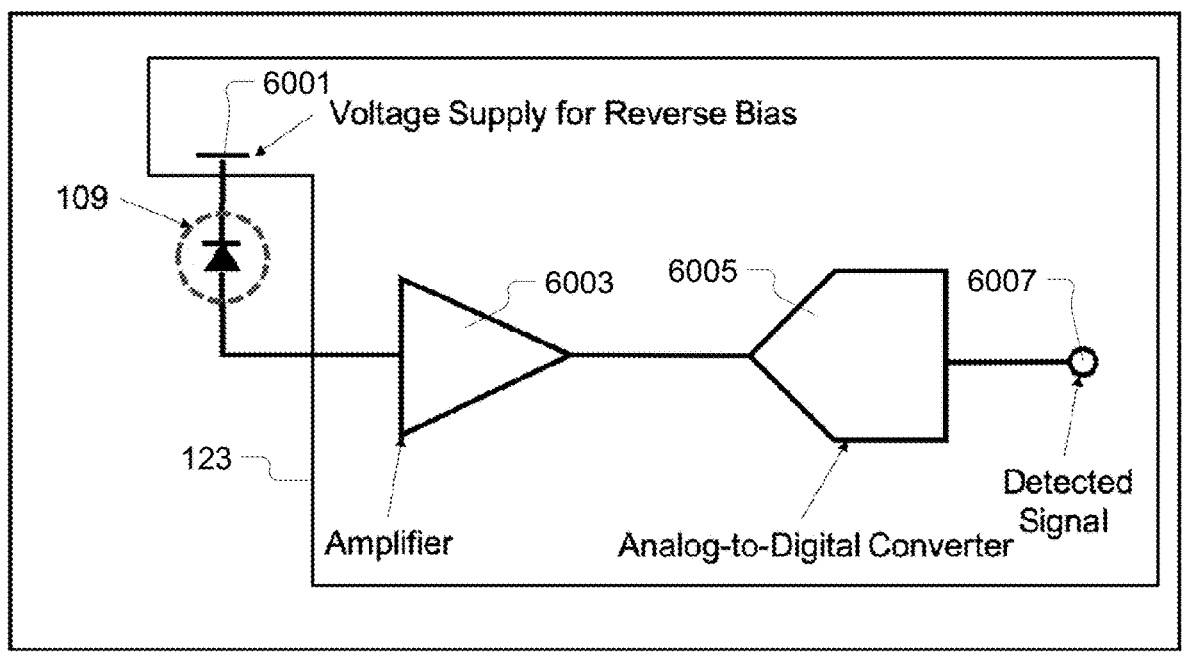
FIG. 1H shows an example schematic of the detecting circuit, in accordance with some embodiments.

FIG. 1H shows an example schematic of the detecting circuit 123, in accordance with some embodiments. The detecting circuit 123 includes a voltage supply 6001 connected to supply voltage to one of either the first implant region 111 or the second implant region 113 of the photodetector device 109. The detecting circuit 123 also includes an electrical amplifier 6003 having an input connected to the implant region (one of the first implant region 111 or the second implant region 113) of the photodetector device 109 that is not connected to the voltage supply 6001. The detecting circuit 123 also includes an analog-to-digital converter 6005 having an input connected to an output of the electrical amplifier 6003. The analog-to-digital converter 6005 converts the electrical signal received at its input into a digital signal that is provided as a detected signal at an output 6007 of the detecting circuit 123.

Figure 1I:
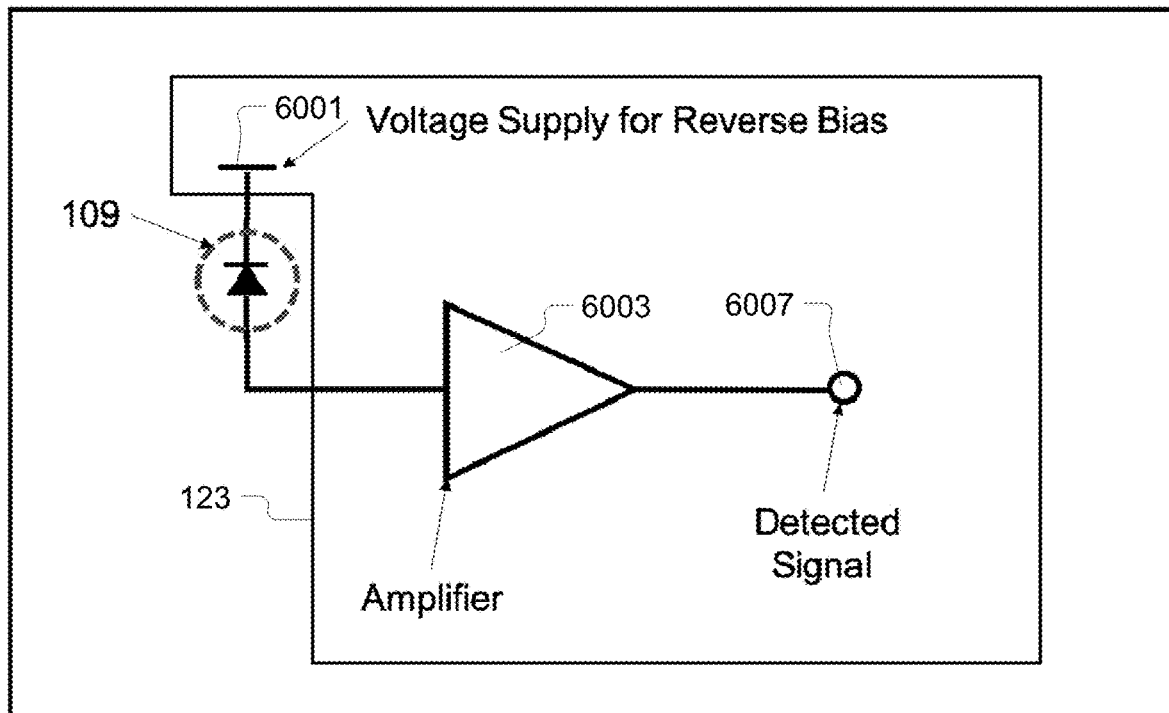
FIG. 1I shows another example schematic of the detecting circuit, in accordance with some embodiments.

FIG. 1I shows another example schematic of the detecting circuit 123, in accordance with some embodiments. The detecting circuit 123 includes the voltage supply 6001 connected to supply voltage to one of either the first implant region 111 or the second implant region 113 of the photodetector device 109. The detecting circuit 123 also includes the electrical amplifier 6003 having an input connected to the implant region (one of the first implant region 111 or the second implant region 113) of the photodetector device 109 that is not connected to the voltage supply 6001. The electrical amplifier 6003 has an output connected to the output of the detecting circuit 123. In this manner, the electrical signal output by the electrical amplifier 6003 is provided as the detected signal at the output 6007 of the detecting circuit 123.

Figure 1J:
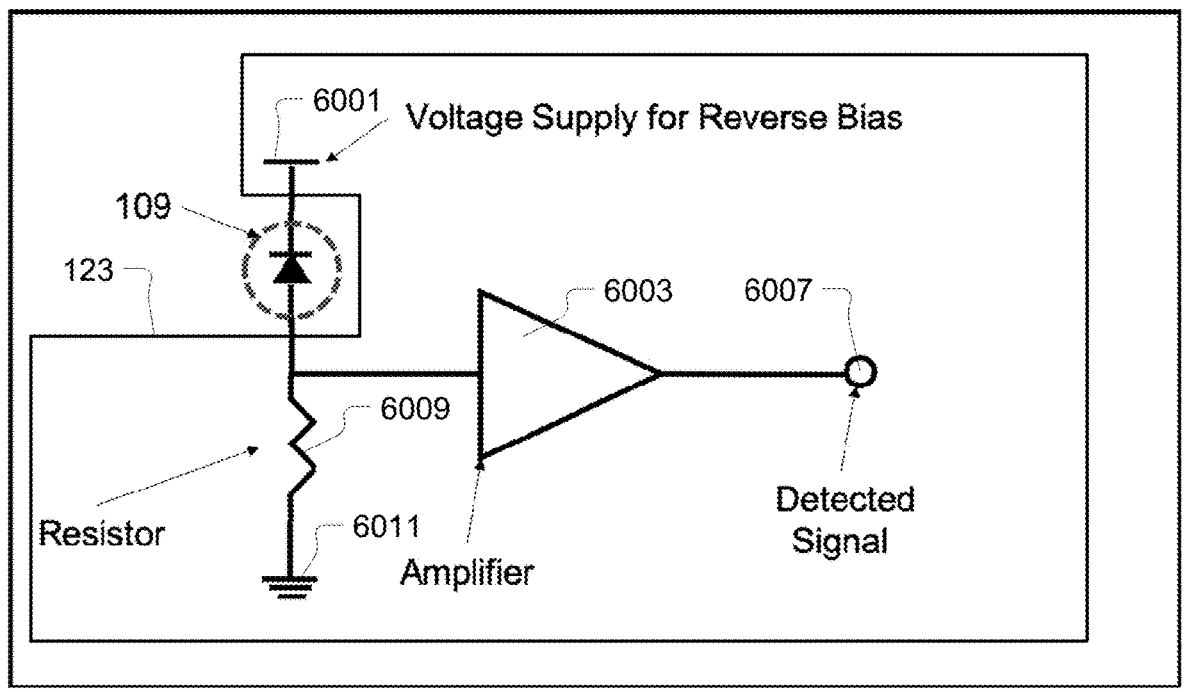
FIG. 1J shows another example schematic of the detecting circuit, in accordance with some embodiments.

FIG. 1J shows another example schematic of the detecting circuit 123, in accordance with some embodiments. The detecting circuit 123 of FIG. 1J is a variation of the detecting circuit 123 of FIG. 1I. Specifically, the detecting circuit 123 of FIG. 1J includes the voltage supply 6001, the electrical amplifier 6003, and the output 6007 connected in the same manner as in FIG. 1I. However, the detecting circuit 123 of FIG. 1J further includes a resistor 6009 connected between the input of the electrical amplifier 6003 and a reference ground potential 6011.

Figure 1K:
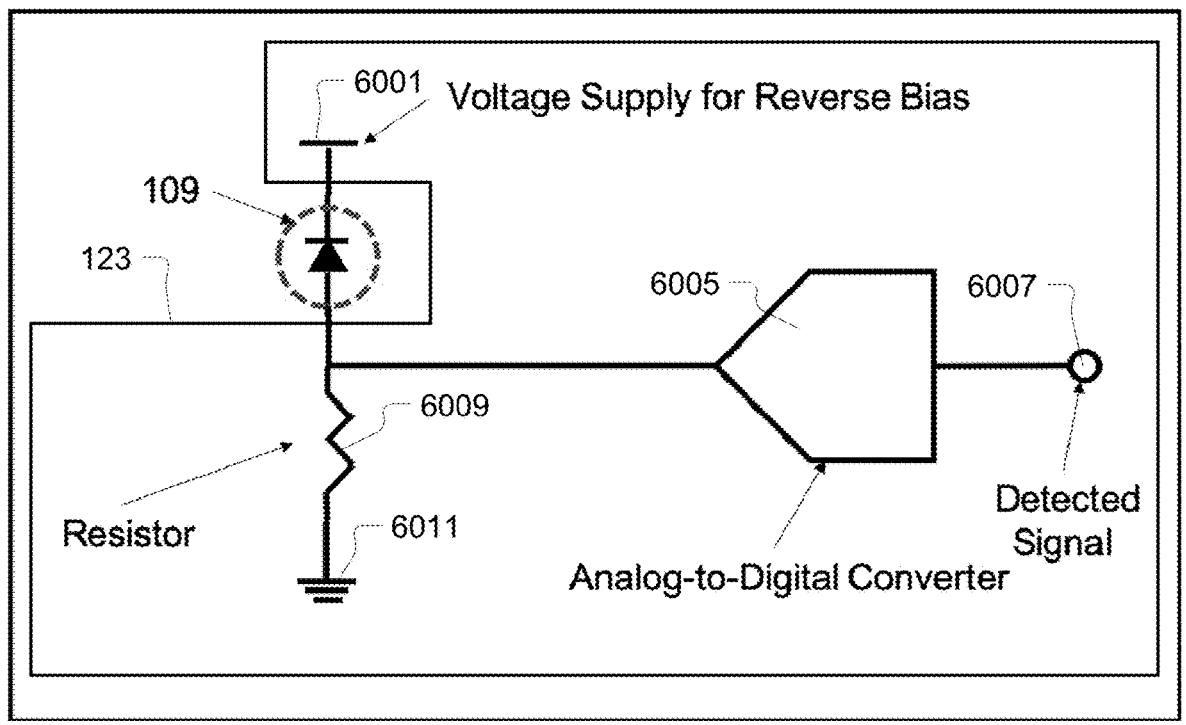
FIG. 1K shows another example schematic of the detecting circuit, in accordance with some embodiments.

FIG. 1K shows another example schematic of the detecting circuit 123, in accordance with some embodiments. The detecting circuit 123 includes the voltage supply 6001 connected to supply voltage to one of either the first implant region 111 or the second implant region 113 of the photodetector device 109. The detecting circuit 123 also includes the analog-to-digital converter 6005 having its input connected to the implant region (one of the first implant region 111 or the second implant region 113) of the photodetector device 109 that is not connected to the voltage supply 6001. The analog-to-digital converter 6005 converts the electrical signal received at its input into a digital signal that is provided as a detected signal at the output 6007 of the detecting circuit 123. Also, the resistor 6009 is connected between the input of the analog-to-digital converter 6005 and the reference ground potential 6011.

Figure 1L:
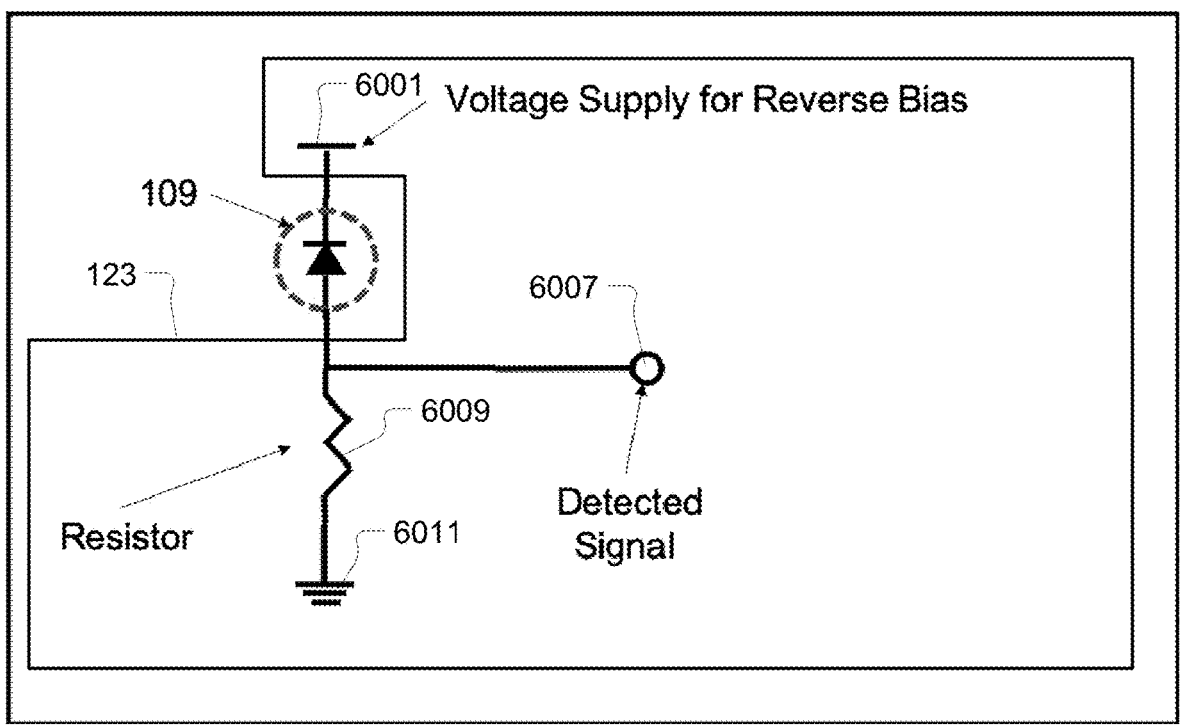
FIG. 1L shows another example schematic of the detecting circuit, in accordance with some embodiments.

FIG. 1L shows another example schematic of the detecting circuit 123, in accordance with some embodiments. The detecting circuit 123 includes the voltage supply 6001 connected to supply voltage to one of either the first implant region 111 or the second implant region 113 of the photodetector device 109. The detecting circuit 123 also includes the resistor 6009 having an input terminal connected to the implant region (one of the first implant region 111 or the second implant region 113) of the photodetector device 109 that is not connected to the voltage supply 6001. The resistor 6009 has an output terminal connected to the reference ground potential 6011. Also, the input terminal of the resistor 6009 is connected to the output 6007 of the detecting circuit.

Figure 2A:
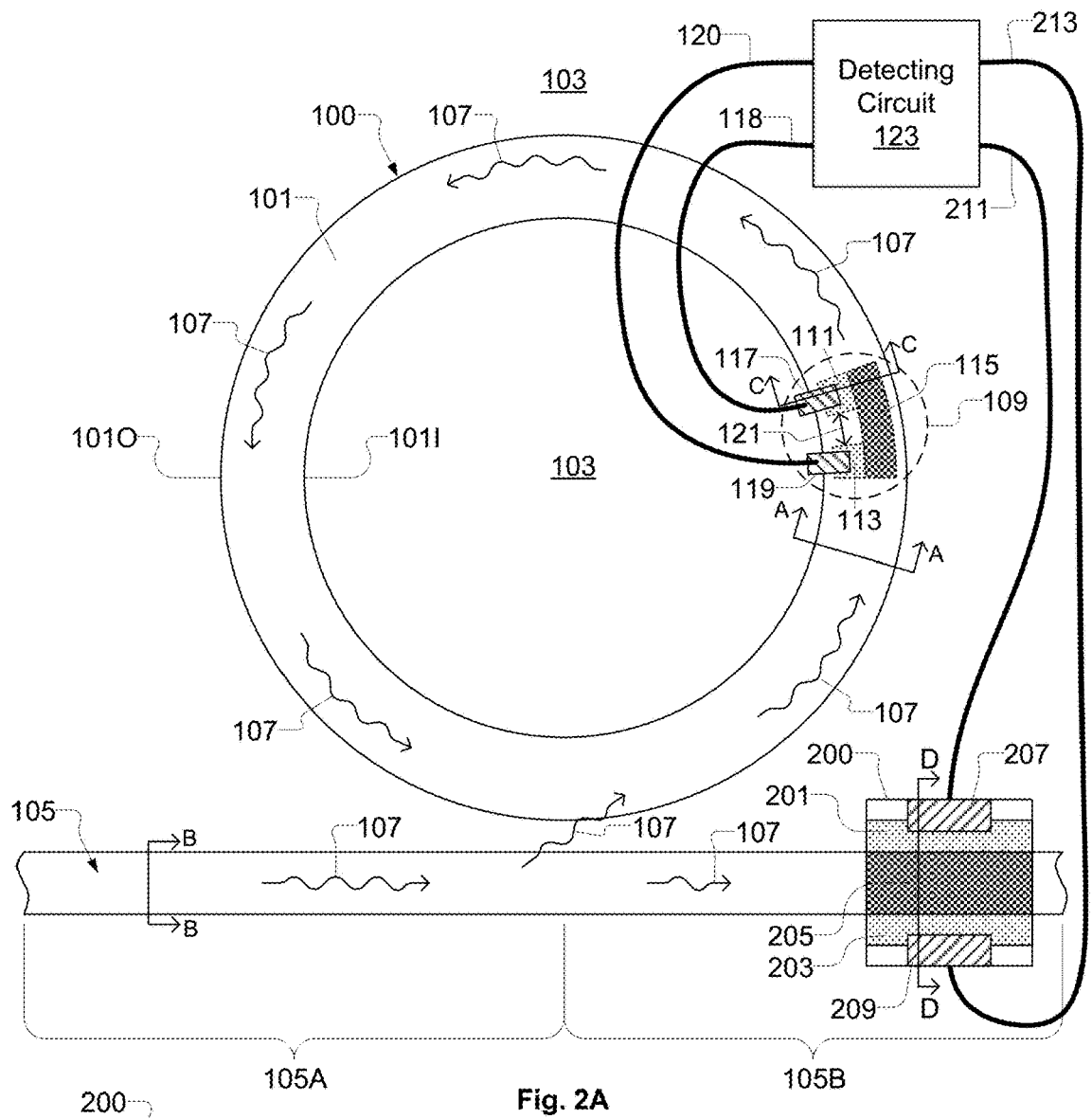
FIG. 2A shows a top view of the ring resonator device and optical waveguide configuration of FIG. 1A, in which an additional photodetector device is placed on and/or optically coupled to the output portion of the optical waveguide, in accordance with some embodiments of the present invention.
Figure 2B:
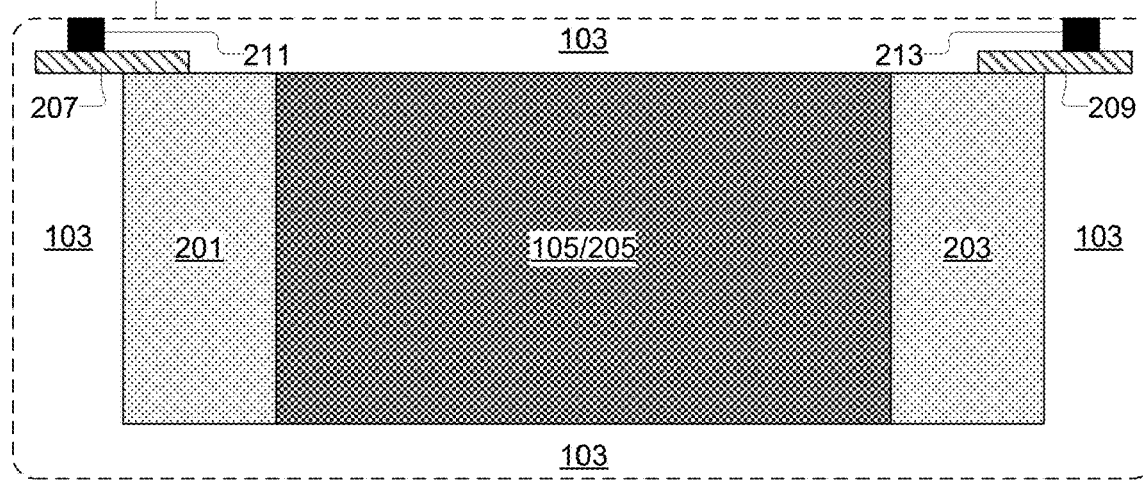
FIG. 2B shows a vertical cross-section view D-D through a section of the photodetector device within optical waveguide, as referenced in FIG. 2A, in accordance with some embodiments of the present invention.

FIG. 2A shows a top view of the ring resonator device 100 and optical waveguide 105 configuration of FIG. 1A, in which an additional photodetector device 200 is placed on and/or optically coupled to the output portion 105B of the optical waveguide 105, in accordance with some embodiments of the present invention. FIG. 2B shows a vertical cross-section view D-D through a section of the photodetector device 200 within optical waveguide 105, as referenced in FIG. 2A, in accordance with some embodiments of the present invention. In FIGS. 2A and 2B, the ring resonator device 100, the built-in photodetector device 109, and the optical waveguide 105 are the same as described with respect to FIGS. 1A through 1F. The photodetector 200 is formed within the optical waveguide 105 at a location optically downstream from a location where the optical waveguide 105 passes closest to the passive optical cavity 101 of the ring resonator device 100. The photodetector 200 is configured and positioned to monitor transmission of optical power from the input portion 105A of the optical waveguide 105 to the output portion 105B of the optical waveguide 105, which in turns provides for monitoring of optical power transmission from the optical waveguide 105 to the passive optical cavity 101 of the ring resonator device 100. The optical power in the passive optical cavity 101 of the ring resonator device 100 will peak at light wavelengths where the optical power transmitted through the output portion 105B of the optical waveguide 105 is minimized. Therefore, a photocurrent detected by the photodetector device 200 can be analyzed in conjunction with a photocurrent detected by the built-in photodetector device 109 of the ring resonator device 100 to increase the accuracy of the measurement of optical power within the passive optical cavity 101 of the ring resonator device 100.

Also, in some embodiments, the photocurrent detected by the photodetector device 200 can be analyzed in conjunction with a photocurrent detected by the built-in photodetector device 109 of the ring resonator device 100 to determine when maximum optical coupling is achieved between the optical waveguide 105 and the passive optical cavity 101 of the ring resonator device 100. In some embodiments, the analysis of the photocurrents of the built-in photodetector device 109 and the photodetector device 200 can be done by the detecting circuit 123. In some embodiments, the analysis of the photocurrents of the built-in photodetector device 109 and the photodetector device 200 can be done by additional circuitry and/or software based on signals generated by the detecting circuit 123.

In some embodiments, the photodetector device 200 is built directly into the optical waveguide 105. However, in some embodiments, the photodetector device 200 can be formed separate from the optical waveguide 105, with the photodetector device 200 positioned close enough to the optical waveguide 200 such that some light 107 traveling through the output portion 105B of the optical waveguide 105 will coupled into the photodetector device 200. The photodetector device 200 includes a first implant region 201 and a second implant region 203. The first implant region 201 is formed by implanting a region with a first type of doping material. Similarly, the second implant region 203 is formed by implanting a region with a second type of doping material. The first type of doping material and the second type of doping material are different. For example, in some embodiments, the first type of doping material can be a p-type doping material, and the second type of doping material can be an n-type doping material. Or, in some embodiments, the first type of doping material can be an n-type doping material, and the second type of doping material can be an p-type doping material. In some embodiments, the p-type doping material can be boron implanted at a concentration within a range extending from about 5E17 atoms/cm$^3$ to about 2E18 atoms/cm$^3$, or within a range extending from about 1E17 atoms/cm$^3$ to about 1E19 atoms/cm$^3$, or within a range greater than or equal to about 1E19 atoms/cm$^3$. It should be understood that in other embodiments, the p-type doping material can be a material other than boron, such as gallium or indium, among others. In some embodiments, the n-type doping material can be phosphorus and/or arsenic implanted at a concentration within a range extending from about 5E17 atoms/cm$^3$ to about 2E18 atoms/cm$^3$, or within a range extending from about 1E17 atoms/cm$^3$ to about 1E19 atoms/cm$^3$, or within a range greater than or equal to about 1E19 atoms/cm$^3$. It should be understood that in other embodiments, the n-type doping material can be a material other than phosphorus or arsenic, such as antimony, bismuth, or lithium, among others.

In the example embodiment of FIG. 2A, the first implant region 201 and the second implant region 203 are positioned on opposite sides of the optical waveguide 105, such that the first implant region 201 and the second implant region 203 collectively form a PIN diode, with a portion of the optical waveguide 105 that extends between the first implant region 201 and the second implant region 203 functioning as an intrinsic absorption region 205. The intrinsic absorption region 205 represents the detecting region (photodiode junction) of the photodetector device 200. In the example embodiment of FIG. 2A, the photodetector device 200 is built into the optical waveguide 105 to absorb a fraction of the light 107 that passes through the output portion 105B of the optical waveguide 105 and generate a corresponding electrical signal that can be monitored and measured. In some embodiments, the first implant region 201, the second implant region 203, and the intrinsic absorption region 205 extend through a majority of the entire vertical thickness of the optical waveguide 105. In some embodiments, the first implant region 201, the second implant region 203, an the intrinsic absorption region 205 extend through essentially the entire vertical thickness of the optical waveguide 105.

In some embodiments, the intrinsic absorption region 205 is formed of a semiconductor material that has sufficient optical absorption at the optical wavelength of operation of the ring resonator device 100, such that the optical wavelength that causes photocurrent generation in the photodetector device 200 is about the same as the optical wavelength of operation of the ring resonator device 100. In some embodiments, the intrinsic absorption region 205 is formed of the same material that forms the optical waveguide 105. In some embodiments, the intrinsic absorption region 205 is formed by modifying the material that forms the optical waveguide 105. In some embodiments, the intrinsic absorption region 205 is formed by a material that is different from the material that forms the optical waveguide 105. As the light 107 travels through the intrinsic absorption region 205, photoabsorption occurs in the intrinsic absorption region 205. More specifically, as light 107 travels through the intrinsic absorption region 205, photons of the light 107 are absorbed to generate charge carriers, i.e., to generate free electrons and corresponding "holes" (positive charges due to movement of free electrons), within the intrinsic absorption region 205. The photodetector device 200 is operated to generate an electric field between the first implant region 201 and the second implant region 203 and through the intrinsic absorption region 205, where this electric field functions as a charge collection field. The charge carriers generated by photoabsorption within the intrinsic absorption region 205 are collected into the first implant region 201 and the second implant region 203 under the influence of the charge collection field and generate a photocurrent that is measurable by the detecting circuit 123.

The photodetector device 200 includes a first electrical contact 207 configured and positioned to electrically connect with the first implant region 201. The photodetector device 200 also includes a second electrical contact 209 configured and positioned to electrically connect with the second implant region 203. In various embodiments, the first electrical contact 207 and the second electrical contact 209 can be configured and positioned as needed to electrically connect with the first implant region 201 and the second implant region 203, respectively. In various embodiments, the first electrical contact 207 and the second electrical contact 209 can be formed by one or more of copper, aluminum, platinum, titanium, nickel, cobalt, tungsten, platinum silicide, titanium silicide, nickel silicide, and cobalt silicide, or any other electrically conductive material used to form Osmic contacts with optical waveguide materials, such as silicon.

The first electrical contact 207 is electrically connected to the detecting circuit 123 by an electrical connection 211. The second electrical contact 209 is electrically connected to the detecting circuit 123 by an electrical connection 213. The detecting circuit 123 operates to monitor and measure electrical current that flows between and through the first electrical contact 211 and the second electrical contact 213, by way of the first implant region 201 and the second implant region 203, respectively. The detecting circuit 123 also operates to apply opposite voltages to the first electrical contact 207 and the second electrical contact 209 such that the photodetector device 200 operates as a reverse-biased PIN diode. For example, if the first implant region 201 is doped as a p-type region and the second implant region 203 is doped as an n-type region, then the detecting circuit 123 operates to apply a positive voltage to the first electrical contact 207 and a negative voltage to the second electrical contact 209. Or, if the first implant region 201 is doped as an n-type region and the second implant region 203 is doped as a p-type region, then the detecting circuit 123 operates to apply a negative voltage to the first electrical contact 207 and a positive voltage to the second electrical contact 209.

With the detecting circuit 123 operating to apply the opposite voltages to the first electrical contact 207 and the second electrical contact 209, the charge collection field is generated within the intrinsic absorption region 205. And, as photoabsorption-generated charge carriers are swept from the intrinsic absorption region 205 into the first implant region 201 and the second implant region 203, a corresponding electrical current is detected by the detecting circuit 123. The strength of the electrical current signal generated by the photodetector device 200 is correlated to the level of optical power in the output portion 105B of the optical waveguide 105 that did not couple into the ring resonator device 100. In some embodiments, the photoabsorption-generated electrical current detected by the photodetector device 200 and detecting circuit 123 is used to assist with measurement of an amount of optical power present in the ring resonator device 100 and/or with measurement of an amount of change in optical power present in the ring resonator device 100. In view of the foregoing, it should be understood that the photodetector device 200 and the detecting circuit 123 are usable to assist with monitoring either absolute optical power and/or a change in optical power within the ring resonator device 100 in real-time.

Figure 3A:
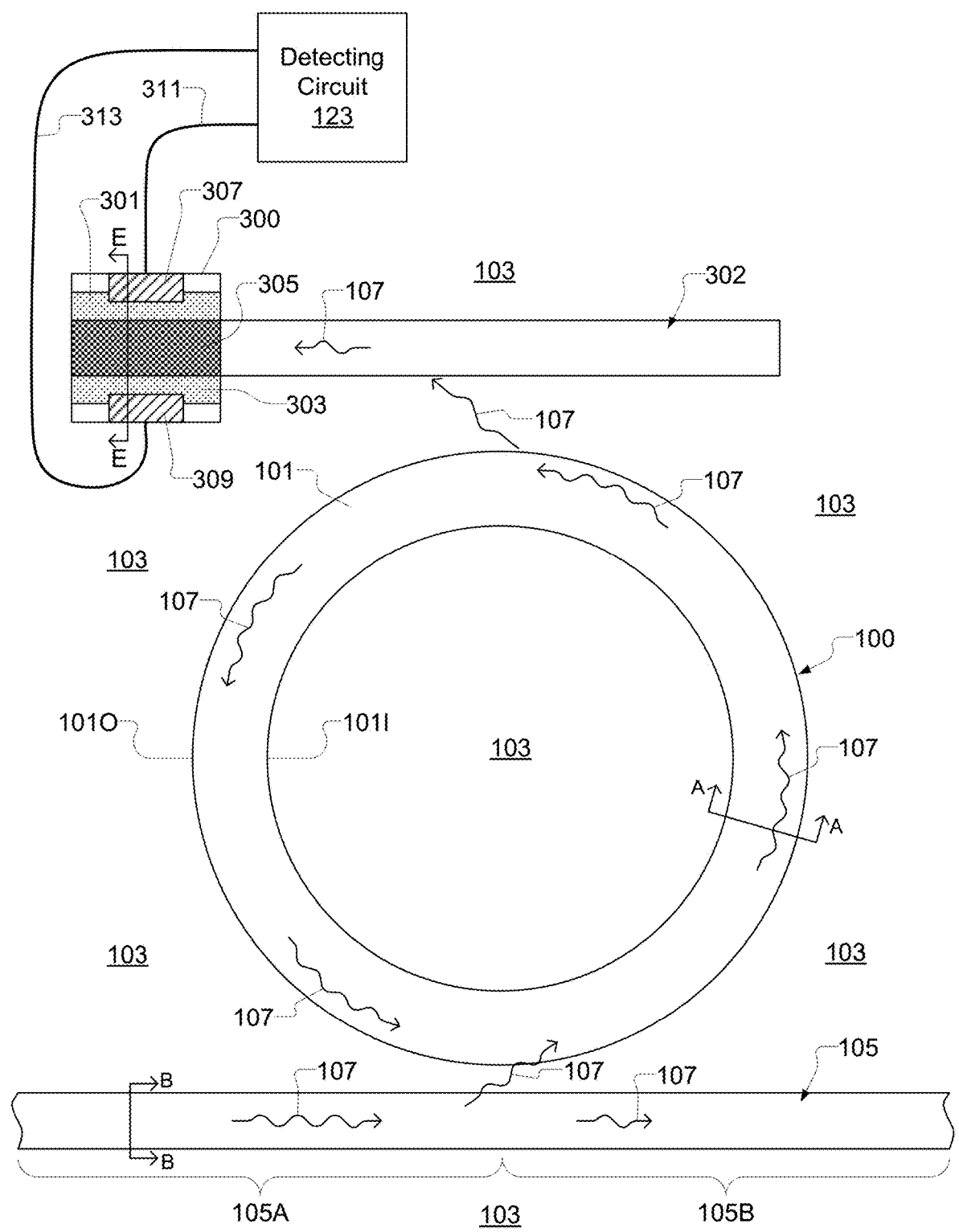
FIG. 3A shows a top view of the ring resonator device and optical waveguide configuration of FIG. 1A, in which a photodetector device is placed on and/or optically coupled to a tap-off optical waveguide, in accordance with some embodiments of the present invention.
Figure 3B:
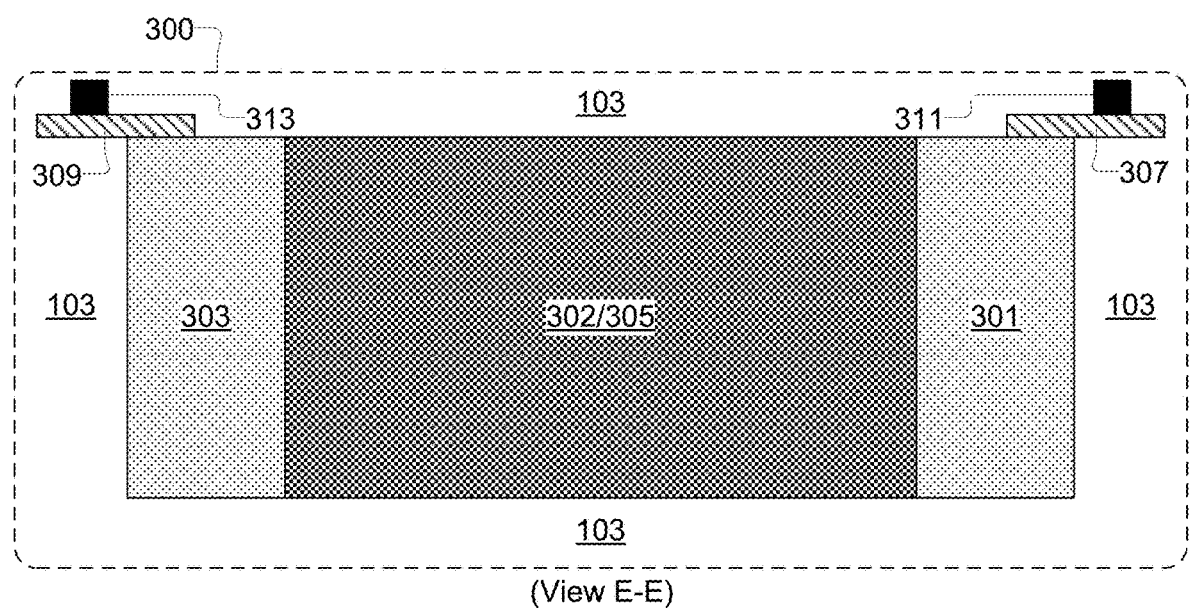
FIG. 3B shows a vertical cross-section view E-E through a section of the photodetector device within the tap-off optical waveguide, as referenced in FIG. 3A, in accordance with some embodiments of the present invention.

FIG. 3A shows a top view of the ring resonator device 100 and optical waveguide 105 configuration of FIG. 1A, in which a photodetector device 300 is placed on and/or optically coupled to a tap-off optical waveguide 302, in accordance with some embodiments of the present invention. FIG. 3B shows a vertical cross-section view E-E through a section of the photodetector device 300 within the tap-off optical waveguide 302, as referenced in FIG. 3A, in accordance with some embodiments of the present invention. In the embodiment of FIGS. 3A and 3B, the photodetector device 109 is not built into the passive optical cavity 101 of the ring resonator device 100. The photodetector device 300 on the tap-off optical waveguide 302 in the embodiment of FIG. 3A is used instead of the photodetector device 109 built into the passive optical cavity 101 of the ring resonator device 100 in the embodiment of FIG. 1A. The tap-off optical waveguide 302 is positioned next to passive optical cavity 101 of the ring resonator device 100, such that some light 107 traveling through the passive optical cavity 101 can evanescently couple into the tap-off optical waveguide 302. In some embodiments, the tap-off waveguide 302 is positioned farther from the passive optical cavity 101 than the optical waveguide 105, in order to tap a small fraction of the optical power present in the passive optical cavity 101 for power monitoring. In some embodiments, the tap-off optical waveguide 302 is configured to extend along a coupling region next to the passive optical cavity 101 to a termination location. In some embodiments, the tap-off optical waveguide 302 can be configured to terminate just past the effective coupling region between the tap-off waveguide 302 and the passive optical cavity 101. In some embodiments, the tap-off optical waveguide 302 can be configured to extend a relatively large distance away from the ring resonator device 100.

In the example of FIG. 3A, the tap-off optical waveguide 302 has a substantially linear configuration as it extends past the ring resonator device 100. However, in other embodiments the tap-off optical waveguide 302 can have a nonlinear configuration, such that the tap-off optical waveguide 302 curves around a portion of the ring resonator device 100. In some embodiments, a portion of the tap-off optical waveguide 302 that curves around the portion of ring resonator device 100 can have a radius of curvature similar to that of the passive optical cavity 101 of the ring resonator device 100. It should be understood that the tap-off optical waveguide 302 is configured (shaped, sized, and positioned) to enable coupling of some light 107 from the passive optical cavity 101 into the tap-off waveguide 302, without coupling of a significant amount of light 107 away from the passive optical cavity 101.

In some embodiments, the material composition and dimensions of the tap-off optical waveguide 302 are configured such that only desired optical modes of light couple into the tap-off optical waveguide 302. For example, in some embodiments, the tap-off optical waveguide 302 is configured such that coupling of light into the tap-off optical waveguide 302 is limited to a fundamental optical mode of the light. In various embodiments, the tap-off optical waveguide 302 can be formed of essentially any material through which light can be channeled. For example, in various embodiments, the tap-off optical waveguide 302 can be formed of glass, SiN, $SiO_2$, germanium-oxide, and/or silica, among other materials. In some embodiments, the tap-off optical waveguide 302 is configured to maintain a polarization of light as it travels through the tap-off optical waveguide 302.

In some embodiments, the tap-off optical waveguide 302 can have a vertical cross-section like the vertical cross-section (view B-B) of the optical waveguide 105, as shown in FIG. 1D. Also, in these embodiments, the tap-off optical waveguide 302 can have dimensions like those described with regard to FIG. 1D for the vertical cross-section (view B-B) of the optical waveguide 105. In some embodiments, the tap-off optical waveguide 302 can have a vertical cross-section like the vertical cross-section (view B-B) of the optical waveguide 105, as shown in FIG. 1E. Also, in these embodiments, the tap-off optical waveguide 302 can have dimensions like those described with regard to FIG. 1E for the vertical cross-section (view B-B) of the optical waveguide 105.

The photodetector device 300 includes a first implant region 301 and a second implant region 303. The first implant region 301 is formed by implanting a region with a first type of doping material. Similarly, the second implant region 303 is formed by implanting a region with a second type of doping material. The first type of doping material and the second type of doping material are different. For example, in some embodiments, the first type of doping material can be a p-type doping material, and the second type of doping material can be an n-type doping material. Or, in some embodiments, the first type of doping material can be an n-type doping material, and the second type of doping material can be an p-type doping material. In some embodiments, the p-type doping material can be boron implanted at a concentration within a range extending from about 5E17 atoms/$cm^3$ to about 2E18 atoms/$cm^3$, or within a range extending from about 1E17 atoms/$cm^3$ to about 1E19 atoms/$cm^3$, or within a range greater than or equal to about 1E19 atoms/$cm^3$. It should be understood that in other embodiments, the p-type doping material can be a material other than boron, such as gallium or indium, among others. In some embodiments, the n-type doping material can be phosphorus and/or arsenic implanted at a concentration within a range extending from about 5E17 atoms/$cm^3$ to about 2E18 atoms/$cm^3$, or within a range extending from about 1E17 atoms/$cm^3$ to about 1E19 atoms/$cm^3$, or within a range greater than or equal to about 1E19 atoms/$cm^3$. It should be understood that in other embodiments, the n-type doping material can be a material other than phosphorus or arsenic, such as antimony, bismuth, or lithium, among others.

In the example embodiment of FIG. 3A, the first implant region 301 and the second implant region 303 are positioned on opposite sides of the tap-off optical waveguide 302, such that the first implant region 301 and the second implant region 303 collectively form a PIN diode, with a portion of the tap-off optical waveguide 302 that extends between the first implant region 301 and the second implant region 303 functioning as an intrinsic absorption region 305. The intrinsic absorption region 305 represents the detecting region (photodiode junction) of the photodetector device 300. In the example embodiment of FIG. 3A, the photodetector device 300 is built into the tap-off optical waveguide 302 to absorb a fraction of the light 107 that couples into the tap-off optical waveguide 302 and generate a corresponding electrical signal that can be monitored and measured. In some embodiments, the first implant region 301, the second implant region 303, and the intrinsic absorption region 305 extend through a majority of the entire vertical thickness of the tap-off optical waveguide 302. In some embodiments, the first implant region 301, the second implant region 303, and the intrinsic absorption region 305 extend through essentially the entire vertical thickness of the tap-off optical waveguide 302.

In some embodiments, the intrinsic absorption region 305 is formed of a semiconductor material that has sufficient optical absorption at the optical wavelength of operation of the ring resonator device 100, such that the optical wavelength that causes photocurrent generation in the photodetector device 300 is about the same as the optical wavelength of operation of the ring resonator device 100. In some embodiments, the intrinsic absorption region 305 is formed of the same material that forms the tap-off optical waveguide 302. In some embodiments, the intrinsic absorption region 305 is formed by modifying the material that forms the tap-off optical waveguide 302. In some embodiments, the intrinsic absorption region 305 is formed by a material that is different from the material that forms the tap-off optical waveguide 302. As the light 107 travels through the intrinsic absorption region 305, photoabsorption occurs in the intrinsic absorption region 305. More specifically, as light 107 travels through the intrinsic absorption region 305, photons of the light 107 are absorbed to generate charge carriers, i.e., to generate free electrons and corresponding "holes" (positive charges due to movement of free electrons), within the intrinsic absorption region 305. The photodetector device 300 is operated to generate an electric field between the first implant region 301 and the second implant region 303 and through the intrinsic absorption region 305, where this electric field functions as a charge collection field. The charge carriers generated by photoabsorption within the intrinsic absorption region 305 are collected into the first implant region 301 and the second implant region 303 under the influence of the charge collection field and generate a photocurrent that is measurable by the detecting circuit 123.

The photodetector device 300 includes a first electrical contact 307 configured and positioned to electrically connect with the first implant region 301. The photodetector device 300 also includes a second electrical contact 309 configured and positioned to electrically connect with the second implant region 303. In various embodiments, the first electrical contact 307 and the second electrical contact 309 can be configured and positioned as needed to electrically connect with the first implant region 301 and the second implant region 303, respectively. In various embodiments, the first electrical contact 307 and the second electrical contact 309 can be formed by one or more of copper, aluminum, platinum, titanium, nickel, cobalt, tungsten, platinum silicide, titanium silicide, nickel silicide, and cobalt silicide, or any other electrically conductive material used to form Osmic contacts with optical waveguide materials, such as silicon.

The first electrical contact 307 is electrically connected to the detecting circuit 123 by an electrical connection 311. The second electrical contact 309 is electrically connected to the detecting circuit 123 by an electrical connection 313. The detecting circuit 123 operates to monitor and measure electrical current that flows between and through the first electrical contact 311 and the second electrical contact 313, by way of the first implant region 301 and the second implant region 303, respectively. The detecting circuit 123 also operates to apply opposite voltages to the first electrical contact 307 and the second electrical contact 309 such that the photodetector device 300 operates as a reverse-biased PIN diode. For example, if the first implant region 301 is doped as a p-type region and the second implant region 303 is doped as an n-type region, then the detecting circuit 123 operates to apply a positive voltage to the first electrical contact 307 and a negative voltage to the second electrical contact 309. Or, if the first implant region 301 is doped as an n-type region and the second implant region 303 is doped as a p-type region, then the detecting circuit 123 operates to apply a negative voltage to the first electrical contact 307 and a positive voltage to the second electrical contact 309.

With the detecting circuit 123 operating to apply the opposite voltages to the first electrical contact 307 and the second electrical contact 309, the charge collection field is generated within the intrinsic absorption region 305. And, as photoabsorption-generated charge carriers are swept from the intrinsic absorption region 305 into the first implant region 301 and the second implant region 303, a corresponding electrical current is detected by the detecting circuit 123. The strength of the electrical current signal generated by the photodetector device 300 is correlated to the level of optical power in the passive optical cavity 101 of the ring resonator device 100. In some embodiments, the photoabsorption-generated electrical current detected by the photodetector device 300 and detecting circuit 123 is used to assist with measurement of an amount of optical power present in the ring resonator device 100 and/or with measurement of an amount of change in optical power present in the ring resonator device 100. In view of the foregoing, it should be understood that the photodetector device 300 and the detecting circuit 123 are usable to assist with monitoring either absolute optical power and/or a change in optical power within the ring resonator device 100 in real-time.

Placement of the photodetector device 300 on the tap-off optical waveguide 302 external to the passive optical cavity 101 of the ring resonator device 100 provides more flexibility in photodetector device 300 design, while minimizing impact on the performance of the ring resonator device 100. In the example embodiment of FIGS. 3A and 3B, some fraction of the ring resonator device 100 optical power can be tapped by (coupled into) the tap-off optical waveguide 302 and routed to the external photodetector device 300. The fraction of optical power that is tapped by the tap-off optical waveguide 302 can be tuned by appropriate design and placement of the tap-off optical waveguide 302, so that the perturbation to the ring resonator device 100 functionality is small, while the amount of optical power that is tapped by the tap-off optical waveguide 302 and routed to external photodetector device 300 is sufficient to be measured accurately.

Figure 3C:
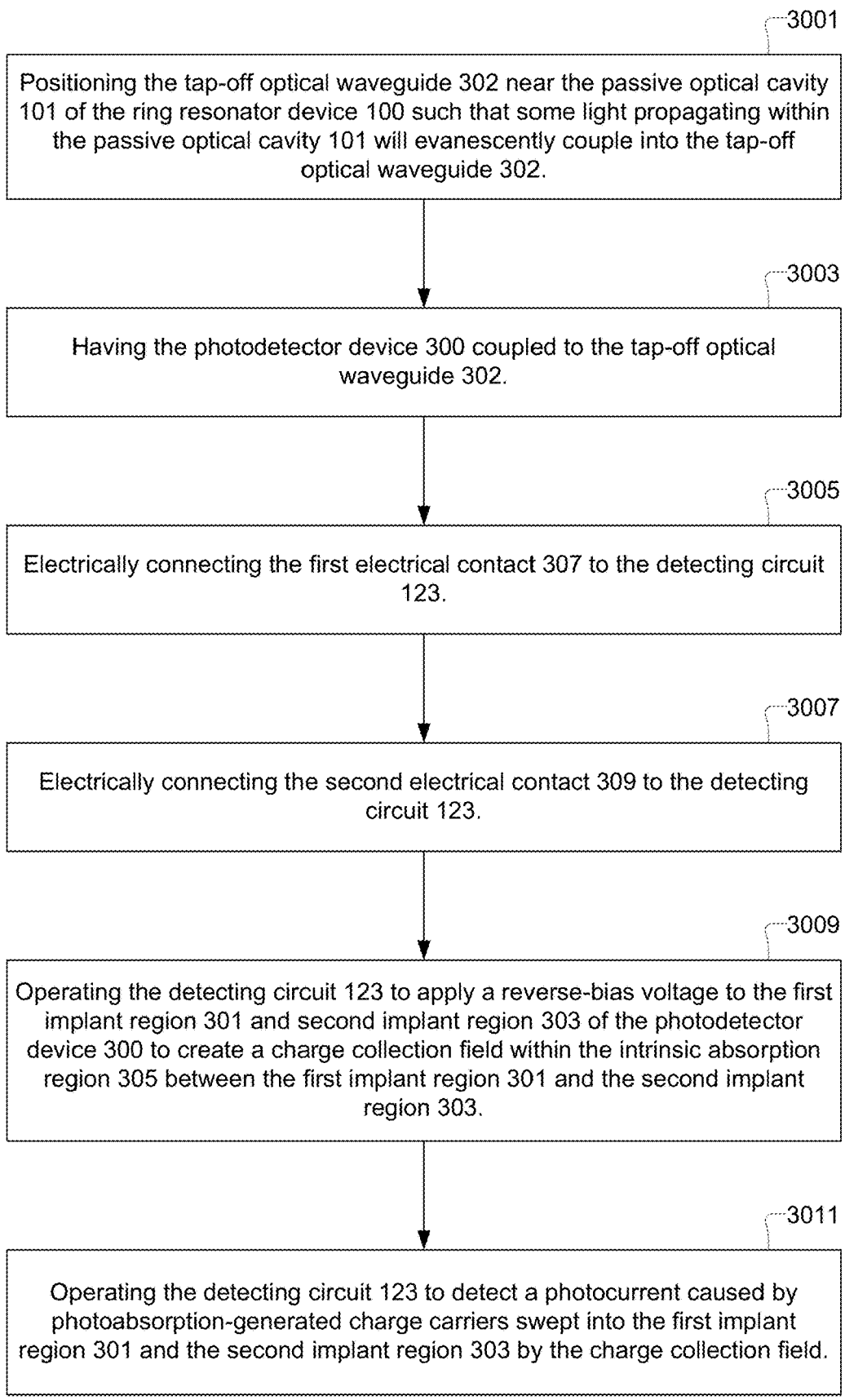
FIG. 3C shows a flowchart of a method for detecting optical power in a ring resonator device, in accordance with some embodiments.

FIG. 3C shows a flowchart of a method for detecting optical power in a ring resonator device, in accordance with some embodiments. The method includes an operation 3001 for positioning a tap-off optical waveguide (302) near a passive optical cavity (101) of a ring resonator device (100) such that some light propagating within the passive optical cavity (101) will evanescently couple into the tap-off optical waveguide (302). In some embodiments, the tap-off optical waveguide (302) is configured to limit coupling of light into the tap-off optical waveguide (302) to a fundamental mode of light within the passive optical cavity (101) of the ring resonator device (100). The method also includes an operation 3003 for having a photodetector device (300) coupled to the tap-off optical waveguide (302). The photodetector device (300) includes a first implant region (301) formed on a first side of the tap-off optical waveguide (302), and a second implant region (303) formed on a second side of the tap-off optical waveguide (302) opposite from the first implant region (301). The first implant region (301) includes a first type of implanted doping material. The second implant region (303) includes a second type of implanted doping material. The second type of implanted doping material is different than the first type of implanted doping material. The photodetector device (300) includes an intrinsic absorption region (305) within the tap-off optical waveguide (302) between the first implant region (301) and the second implant region (303). The photodetector device (300) includes a first electrical contact (307) electrically connected to the first implant region (301), and a second electrical contact (309) electrically connected to the second implant region (303). In some embodiments, the first electrical contact (307) and the second electrical contact (309) are positioned physically separate from the tap-off optical waveguide (302).

The method also includes an operation 3005 for electrically connecting the first electrical contact (307) to a detecting circuit (123). The method also includes an operation 3007 for electrically connecting the second electrical contact (309) to the detecting circuit (123). The method also includes an operation 3009 for operating the detecting circuit (123) to apply a reverse-bias voltage to the first implant region (301) and second implant region (303) of the photodetector device (300) to create a charge collection field within the intrinsic absorption region (305) between the first implant region (301) and the second implant region (303). The method also includes an operation 3011 for operating the detecting circuit (123) to detect a photocurrent caused by photoabsorption-generated charge carriers swept into the first implant region (301) and the second implant region (303) by the charge collection field.

Figure 4A:
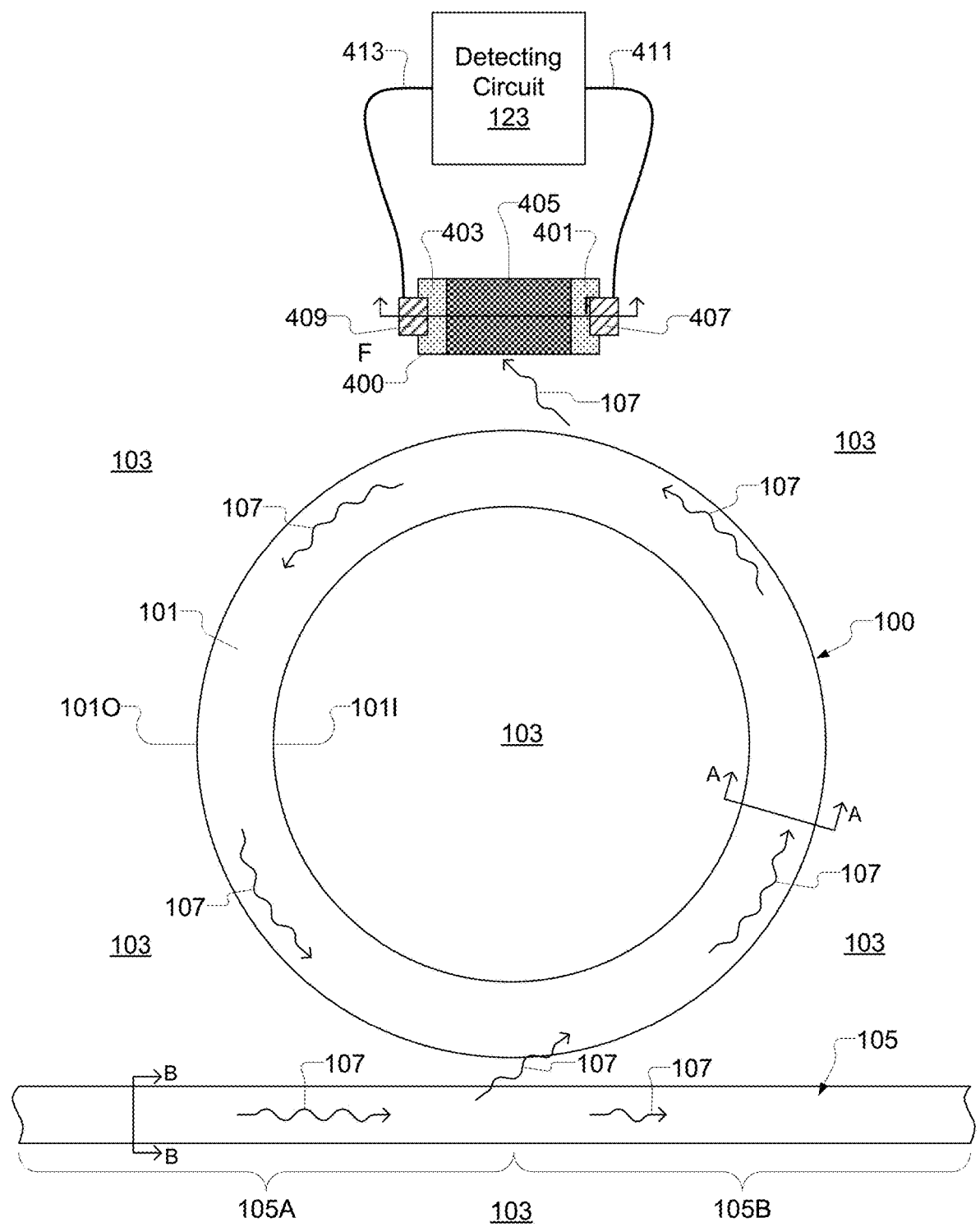
FIG. 4A shows a top view of the ring resonator device and optical waveguide configuration of FIG. 1A, in which a photodetector device is formed outside of the passive optical cavity of the ring resonator device and is optically coupled to the passive optical cavity of the ring resonator device, in accordance with some embodiments of the present invention.
Figure 4B:
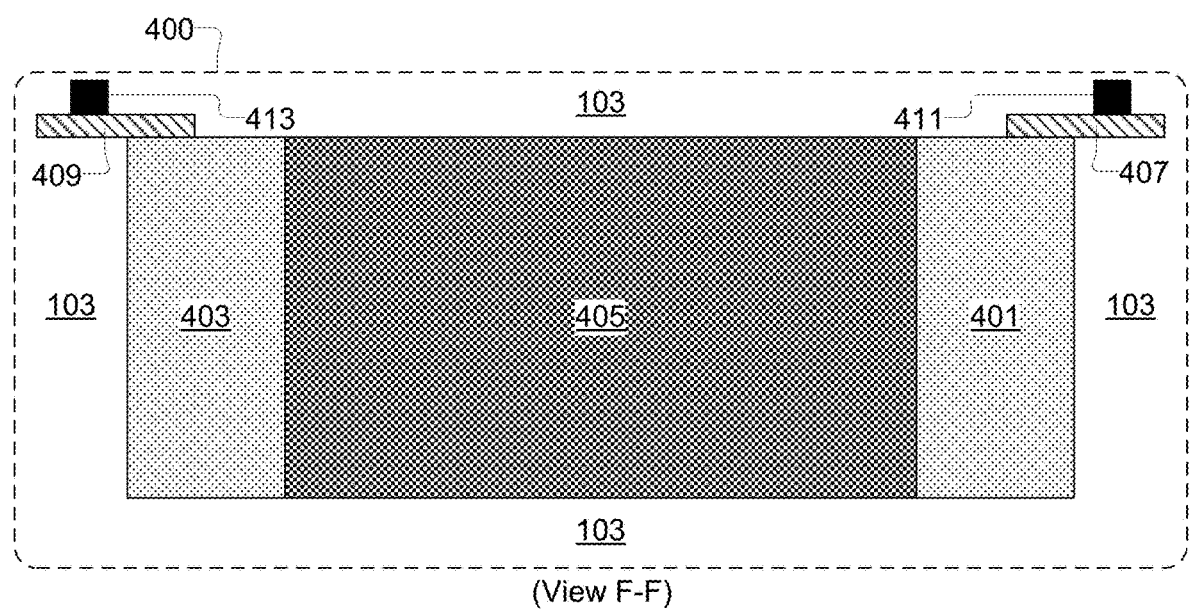
FIG. 4B shows a vertical cross-section view F-F through a section of the photodetector device, as referenced in FIG. 4A, in accordance with some embodiments of the present invention.

FIG. 4A shows a top view of the ring resonator device 100 and optical waveguide 105 configuration of FIG. 1A, in which a photodetector device 400 is formed outside of the passive optical cavity 101 of the ring resonator device 100 and is optically coupled to the passive optical cavity 101 of the ring resonator device 100, in accordance with some embodiments of the present invention. FIG. 4B shows a vertical cross-section view F-F through a section of the photodetector device 400, as referenced in FIG. 4A, in accordance with some embodiments of the present invention. In the embodiment of FIGS. 4A and 4B, the photodetector device 109 is not built into the passive optical cavity 101 of the ring resonator device 100. The photodetector device 400 in the embodiment of FIG. 4A is used instead of the photodetector device 109 built into the passive optical cavity 101 of the ring resonator device 100 in the embodiment of FIG. 1A. The photodetector device 400 is configured and positioned next to passive optical cavity 101 of the ring resonator device 100, such that some light 107 traveling through the passive optical cavity 101 can evanescently couple into the photodetector device 400. In some embodiments, the photodetector device 400 is positioned farther from the passive optical cavity 101 than the optical waveguide 105, in order to tap a small fraction of the optical power present in the passive optical cavity 101 for power monitoring.

The photodetector device 400 includes a first implant region 401 and a second implant region 403. The first implant region 401 is formed by implanting a region with a first type of doping material. Similarly, the second implant region 403 is formed by implanting a region with a second type of doping material. The first type of doping material and the second type of doping material are different. For example, in some embodiments, the first type of doping material can be a p-type doping material, and the second type of doping material can be an n-type doping material. Or, in some embodiments, the first type of doping material can be an n-type doping material, and the second type of doping material can be an p-type doping material. In some embodiments, the p-type doping material can be boron implanted at a concentration within a range extending from about 5E17 atoms/cm$^3$ to about 2E18 atoms/cm$^3$, or within a range extending from about 1E17 atoms/cm$^3$ to about 1E19 atoms/cm$^3$, or within a range greater than or equal to about 1E19 atoms/cm$^3$. It should be understood that in other embodiments, the p-type doping material can be a material other than boron, such as gallium or indium, among others. In some embodiments, the n-type doping material can be phosphorus and/or arsenic implanted at a concentration within a range extending from about 5E17 atoms/cm$^3$ to about 2E18 atoms/cm$^3$, or within a range extending from about 1E17 atoms/cm$^3$ to about 1E19 atoms/cm$^3$, or within a range greater than or equal to about 1E19 atoms/cm$^3$. It should be understood that in other embodiments, the n-type doping material can be a material other than phosphorus or arsenic, such as antimony, bismuth, or lithium, among others.

In the example embodiment of FIG. 4A, the first implant region 401 and the second implant region 403 are positioned on opposite sides of an intrinsic absorption region 405 to form a PIN diode. The intrinsic absorption region 405 represents the detecting region (photodiode junction) of the photodetector device 400. In the example embodiment of FIG. 4A, the intrinsic absorption region 405 is configured and positioned to absorb a fraction of the light 107 that couples into the photodetector device 400 from the passive optical cavity 101 and generate a corresponding electrical signal that can be monitored and measured. In some embodiments, the intrinsic absorption region 405 is formed of a semiconductor material that has sufficient optical absorption at the optical wavelength of operation of the ring resonator device 100, such that the optical wavelength that causes photocurrent generation in the photodetector device 400 is about the same as the optical wavelength of operation of the ring resonator device 100. As the light 107 travels through the intrinsic absorption region 405, photoabsorption occurs in the intrinsic absorption region 405. More specifically, as light 107 travels through the intrinsic absorption region 405, photons of the light 107 are absorbed to generate charge carriers, i.e., to generate free electrons and corresponding "holes" (positive charges due to movement of free electrons), within the intrinsic absorption region 405. The photodetector device 400 is operated to generate an electric field between the first implant region 401 and the second implant region 403 and through the intrinsic absorption region 405, where this electric field functions as a charge collection field. The charge carriers generated by photoabsorption within the intrinsic absorption region 405 are collected into the first implant region 401 and the second implant region 403 under the influence of the charge collection field and generate a photocurrent that is measurable by the detecting circuit 123.

The photodetector device 400 includes a first electrical contact 407 configured and positioned to electrically connect with the first implant region 401. The photodetector device 400 also includes a second electrical contact 409 configured and positioned to electrically connect with the second implant region 403. In various embodiments, the first electrical contact 407 and the second electrical contact 409 can be configured and positioned as needed to electrically connect with the first implant region 401 and the second implant region 403, respectively. In various embodiments, the first electrical contact 407 and the second electrical contact 409 can be formed by one or more of copper, aluminum, platinum, titanium, nickel, cobalt, tungsten, platinum silicide, titanium silicide, nickel silicide, and cobalt silicide, or any other electrically conductive material used to form Osmic contacts with optical waveguide materials, such as silicon.

The first electrical contact 407 is electrically connected to the detecting circuit 123 by an electrical connection 411. The second electrical contact 409 is electrically connected to the detecting circuit 123 by an electrical connection 413. The detecting circuit 123 operates to monitor and measure electrical current that flows between and through the first electrical contact 411 and the second electrical contact 413, by way of the first implant region 401 and the second implant region 403, respectively. The detecting circuit 123 also operates to apply opposite voltages to the first electrical contact 407 and the second electrical contact 409 such that the photodetector device 400 operates as a reverse-biased PIN diode. For example, if the first implant region 401 is doped as a p-type region and the second implant region 403 is doped as an n-type region, then the detecting circuit 123 operates to apply a positive voltage to the first electrical contact 407 and a negative voltage to the second electrical contact 409. Or, if the first implant region 401 is doped as an n-type region and the second implant region 403 is doped as a p-type region, then the detecting circuit 123 operates to apply a negative voltage to the first electrical contact 407 and a positive voltage to the second electrical contact 409.

With the detecting circuit 123 operating to apply the opposite voltages to the first electrical contact 407 and the second electrical contact 409, the charge collection field is generated within the intrinsic absorption region 405. And, as photoabsorption-generated charge carriers are swept from the intrinsic absorption region 405 into the first implant region 401 and the second implant region 403, a corresponding electrical current is detected by the detecting circuit 123. The strength of the electrical current signal generated by the photodetector device 400 is correlated to the level of optical power in the passive optical cavity 101 of the ring resonator device 100. In some embodiments, the photoabsorption-generated electrical current detected by the photodetector device 400 and detecting circuit 123 is used to assist with measurement of an amount of optical power present in the ring resonator device 100 and/or with measurement of an amount of change in optical power present in the ring resonator device 100. In view of the foregoing, it should be understood that the photodetector device 400 and the detecting circuit 123 are usable to assist with monitoring either absolute optical power and/or a change in optical power within the ring resonator device 100 in real-time.

Placement of the photodetector device 400 external to the passive optical cavity 101 of the ring resonator device 100 provides more flexibility in photodetector device 400 design, while minimizing impact on the performance of the ring resonator device 100. In the example embodiment of FIGS. 4A and 4B, some fraction of the ring resonator device 100 optical power can be coupled into the external photodetector device 400. The fraction of optical power that is coupled into the photodetector device 400 can be tuned by appropriate design and placement of the photodetector device 400, so that the perturbation to the ring resonator device 100 functionality is small, while the amount of optical power that is coupled into the photodetector device 400 is sufficient to be measured accurately.

Figure 4C:
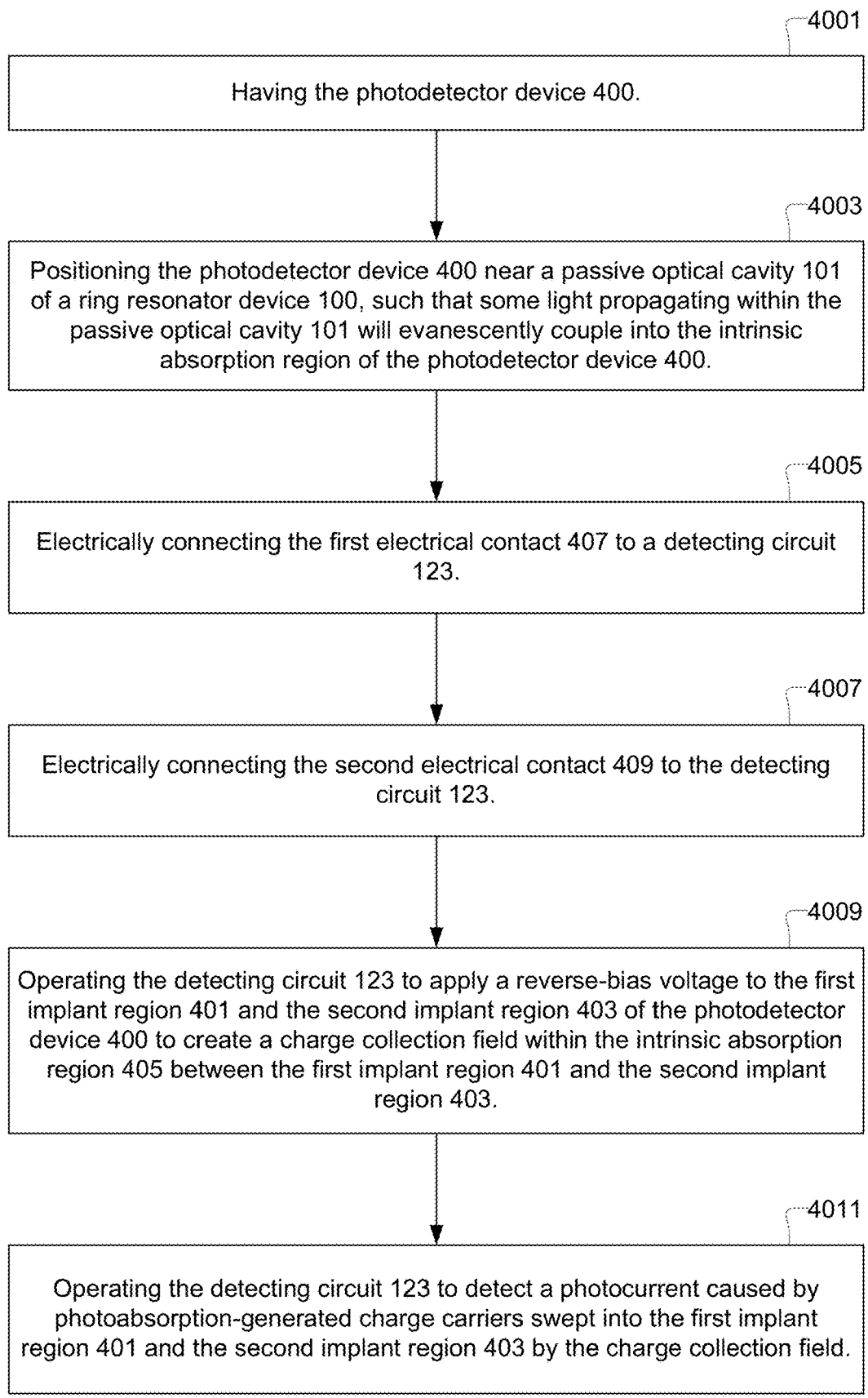
FIG. 4C shows a flowchart of a method for detecting optical power in a ring resonator device, in accordance with some embodiments.

FIG. 4C shows a flowchart of a method for detecting optical power in a ring resonator device, in accordance with some embodiments. The method includes an operation 4001 for having a photodetector device (400) that includes an intrinsic absorption region (405), and a first implant region (401) formed on a first side of the intrinsic absorption region (405), and a second implant region (403) formed on a second side of the intrinsic absorption region (405) opposite from the first implant region (401). In some embodiments, the intrinsic absorption region (405) is configured to limit coupling of light into the intrinsic absorption region (405) to a fundamental mode of light within the passive optical cavity (101) of the ring resonator device (100). The first implant region (401) includes a first type of implanted doping material. The second implant region (403) includes a second type of implanted doping material. The second type of implanted doping material is different than the first type of implanted doping material. The photodetector device (400) includes a first electrical contact (407) electrically connected to the first implant region (401), and a second electrical contact (409) electrically connected to the second implant region (403). In some embodiments, the first electrical contact (407) and the second electrical contact (409) are positioned physically separate from the intrinsic absorption region (405).

The method also includes an operation 4003 for positioning the photodetector device (400) near a passive optical cavity (101) of a ring resonator device (100), such that some light propagating within the passive optical cavity (101) will evanescently couple into the intrinsic absorption region of the photodetector device (400). The method also includes an operation 4005 for electrically connecting the first electrical contact (407) to a detecting circuit (123). The method also includes an operation 4007 for electrically connecting the second electrical contact (409) to the detecting circuit (123). The method also includes an operation 4009 for operating the detecting circuit (123) to apply a reverse-bias voltage to the first implant region (401) and the second implant region (403) of the photodetector device (400) to create a charge collection field within the intrinsic absorption region (405) between the first implant region (401) and the second implant region (403). The method also includes an operation 4011 for operating the detecting circuit (123) to detect a photocurrent caused by photoabsorption-generated charge carriers swept into the first implant region (401) and the second implant region (403) by the charge collection field.

The foregoing description of the embodiments has been provided for purposes of illustration and description. It is not intended to be exhaustive or to limit the invention. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the invention, and all such modifications are intended to be included within the scope of the invention.

Although the foregoing invention has been described in some detail for purposes of clarity of understanding, it will be apparent that certain changes and modifications can be practiced within the scope of the invention description. Accordingly, the present embodiments are to be considered as illustrative and not restrictive, and the invention is not to be limited to the details given herein, but may be modified within the scope and equivalents of the described embodiments.

What is claimed is:

1. A photodetector system, comprising:
a ring resonator device having a passive optical cavity;
a photodetector device built into the passive optical cavity of the ring resonator;
a tap-off optical waveguide positioned next to the passive optical cavity of the ring resonator device such that some light will evanescently couple from the passive optical cavity into the tap-off optical waveguide;
a first implant region formed on a first side of the tap-off optical waveguide, the first implant region having a first type of implanted doping material;
a second implant region formed on a second side of the tap-off optical waveguide opposite from the first implant region, the second implant region having a second type of implanted doping material;
an intrinsic absorption region within the tap-off optical waveguide between the first implant region and the second implant region;
a first electrical contact electrically connected to the first implant region, the first electrical contact electrically connected to a detecting circuit; and
a second electrical contact electrically connected to the second implant region, the second electrical contact electrically connected to the detecting circuit,
wherein the detecting circuit is configured to detect a photocurrent caused by photoabsorption-generated charge carriers swept into the first and second implant regions by a charge collection field, and wherein the detecting circuit is configured to use the detected photocurrent in the tap-off optical waveguide in conjunction with the photodetector device built into the passive optical cavity of the ring resonator to measure an optical power within the passive optical cavity of the ring resonator.

2. The photodetector system as recited in claim 1, wherein the detecting circuit is configured to apply a reverse-bias voltage to the first and second implant regions to create the charge collection field within the intrinsic absorption region within the tap-off optical waveguide between the first and second implant regions.

3. The photodetector system as recited in claim 1, wherein the tap-off optical waveguide is positioned such that light incoupled into the tap-off optical waveguide from the passive optical cavity of the ring resonator propagates toward the intrinsic absorption region.

4. The photodetector system as recited in claim 3, wherein the tap-off optical waveguide is linear-shaped.

5. The photodetector system as recited in claim 3, wherein the tap-off optical waveguide curves around a portion of the passive optical cavity.

6. The photodetector system as recited in claim 3, wherein the tap-off optical waveguide terminates just past an effective optical coupling region between the tap-off optical waveguide and the passive optical cavity.

7. The photodetector system as recited in claim 3, wherein the tap-off optical waveguide is configured to limit coupling of light into the tap-off optical waveguide to a fundamental mode of light within the passive optical cavity.

8. The photodetector system as recited in claim 3, wherein the tap-off optical waveguide is formed of one or more of monocrystalline silicon, polycrystalline silicon, glass, silicon nitride, silicon oxide, and silica.

9. The photodetector system as recited in claim 3, further comprising:
a cladding material surrounding the passive optical cavity and the tap-off optical waveguide, the cladding material having a different index of optical refraction than each of the passive optical cavity and the tap-off optical waveguide.

10. The photodetector system as recited in claim 1, wherein the first type of implanted doping material is a p-type doping material and the second type of implanted doping material is an n-type doping material, or wherein the first type of implanted doping material is the n-type doping material and the second type of implanted doping material is the p-type doping material.

11. The photodetector system as recited in claim 1, wherein the p-type doping material is one or more of boron, gallium, and indium implanted at a concentration within a range extending from about 1E17 atoms/cm$^3$ to about 1E19 atoms/cm$^3$.

12. The photodetector system as recited in claim 1, wherein the n-type doping material is one or more of phosphorous, arsenic, antimony, bismuth, or lithium implanted at a concentration within a range extending from about 1E17 atoms/cm$^3$ to about 1E19 atoms/cm$^3$.

13. The photodetector system as recited in claim 1, wherein the first implant region, the second implant region, and the intrinsic absorption region extend through essentially an entire vertical thickness of the tap-off optical waveguide.

14. The photodetector system as recited in claim 1, wherein the first electrical contact and the second electrical contact are positioned physically separate from the tap-off optical waveguide.

15. The photodetector system as recited in claim 1, wherein the tap-off optical waveguide has a substantially constant vertical thickness within a range extending from about 30 nanometers to about 300 nanometers.

16. The photodetector system as recited in claim 1, wherein the tap-off optical waveguide has a substantially constant width within a range extending from about 300 nanometers to about 1 micrometer.

17. A method for detecting optical power in a ring resonator device, comprising:
positioning a tap-off optical waveguide near a passive optical cavity of a ring resonator device such that some light propagating within the passive optical cavity will evanescently couple into the tap-off optical waveguide;
having a first photodetector device built into the passive optical cavity of the ring resonator device;
having a second photodetector device coupled to the tap-off optical waveguide, the second photodetector device including a first implant region formed on a first side of the tap-off optical waveguide, and a second implant region formed on a second side of the tap-off optical waveguide opposite from the first implant region, the first implant region including a first type of implanted doping material, the second implant region including a second type of implanted doping material, the second type of implanted doping material different than the first type of implanted doping material, the second photodetector device including an intrinsic absorption region within the tap-off optical waveguide between the first implant region and the second implant region, the second photodetector device including a first electrical contact electrically connected to the first implant region, and a second electrical contact electrically connected to the second implant region;
electrically connecting the first electrical contact to a detecting circuit;
electrically connecting the second electrical contact to the detecting circuit;
operating the detecting circuit to apply a reverse-bias voltage to the first and second implant regions of the second photodetector device to create a charge collection field within the intrinsic absorption region between the first and second implant regions; and
operating the detecting circuit to detect a photocurrent caused by photoabsorption-generated charge carriers swept into the first and second implant regions by the charge collection field; and
operating the detecting circuit to use the detected photocurrent in conjunction with another photocurrent detected by the first photodetector device to measure an optical power within the passive optical cavity of the ring resonator device.

18. The method as recited in claim 17, wherein the tap-off optical waveguide is configured to limit coupling of light into the tap-off optical waveguide to a fundamental mode of light within the passive optical cavity.

19. The method as recited in claim 17, wherein the first electrical contact and the second electrical contact are positioned physically separate from the tap-off optical waveguide.

* * * * *